(12) United States Patent
Pulugurtha et al.

(10) Patent No.: US 9,773,888 B2
(45) Date of Patent: Sep. 26, 2017

(54) VERTICAL ACCESS DEVICES, SEMICONDUCTOR DEVICE STRUCTURES, AND RELATED METHODS

(71) Applicant: Micron Technology, Inc., Boise, ID (US)

(72) Inventors: Srinivas Pulugurtha, Boise, ID (US); Haitao Liu, Boise, ID (US); Sanh D. Tang, Boise, ID (US); Wolfgang Mueller, Garden City, ID (US); Sourabh Dhir, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 143 days.

(21) Appl. No.: 14/190,807

(22) Filed: Feb. 26, 2014

(65) Prior Publication Data

US 2015/0243748 A1    Aug. 27, 2015

(51) Int. Cl.
*H01L 27/108* (2006.01)
*H01L 29/66* (2006.01)
*H01L 29/78* (2006.01)

(52) U.S. Cl.
CPC .. *H01L 29/66666* (2013.01); *H01L 27/10823* (2013.01); *H01L 27/10876* (2013.01); *H01L 29/7827* (2013.01)

(58) Field of Classification Search
CPC ........... H01L 29/4236; H01L 29/66666; H01L 29/7827; H01L 21/76254; H01L 45/1233
See application file for complete search history.

(56) References Cited

U.S. PATENT DOCUMENTS

| | | | |
|---|---|---|---|
| 6,593,612 B2 | 7/2003 | Gruening et al. | |
| 7,279,742 B2 | 10/2007 | Gruning-Von Schwerin | |
| 7,491,608 B2 | 2/2009 | Forbes | |
| 8,187,934 B2 | 5/2012 | Wells et al. | |
| 8,222,140 B2 | 7/2012 | Tang et al. | |
| 8,389,360 B2 | 3/2013 | Abbott | |
| 8,409,948 B2 | 4/2013 | Fischer et al. | |
| 8,461,002 B2 | 6/2013 | Forbes | |
| 8,497,541 B2 | 7/2013 | Parekh et al. | |
| 8,501,559 B2 | 8/2013 | Tang et al. | |
| 8,530,295 B2 | 9/2013 | Tang et al. | |
| 2006/0176726 A1 | 8/2006 | Bhattacharyya et al. | |
| 2007/0224753 A1 | 9/2007 | Tang et al. | |
| 2007/0262375 A1 | 11/2007 | Juengling | |
| 2009/0032866 A1 | 2/2009 | McDaniel | |
| 2009/0256187 A1 * | 10/2009 | Kim ............... | H01L 21/823487 257/314 |
| 2011/0298041 A1 * | 12/2011 | Renn ............... | H01L 27/10826 257/330 |

(Continued)

*Primary Examiner* — Frederick B Hargrove
(74) *Attorney, Agent, or Firm* — TraskBritt

(57) ABSTRACT

A vertical access device comprises a semiconductive base comprising a first source/drain region, a semiconductive pillar extending vertically from the semiconductive base, and a gate electrode adjacent a sidewall of the semiconductive pillar. The semiconductive pillar comprises a channel region overlying the first source/drain region, and a second source/drain region overlying the channel region. An opposing sidewall of the semiconductive pillar is not adjacent the gate electrode or another gate electrode. Semiconductive device structures, methods of forming a vertical access device, and methods of forming a semiconductive structure are also described.

23 Claims, 16 Drawing Sheets

(56) References Cited

U.S. PATENT DOCUMENTS

| | | |
|---|---|---|
| 2012/0061807 A1 | 3/2012 | Tran |
| 2012/0104491 A1* | 5/2012 | Heineck ............ H01L 27/10876 257/334 |
| 2012/0126884 A1 | 5/2012 | Juengling |
| 2012/0153379 A1* | 6/2012 | Kim .................. H01L 27/10876 257/329 |
| 2012/0238061 A1* | 9/2012 | Fischer ........... H01L 21/823425 438/157 |
| 2013/0309820 A1 | 11/2013 | Tang et al. |
| 2013/0320433 A1* | 12/2013 | Cho .................. H01L 21/28026 257/329 |

\* cited by examiner

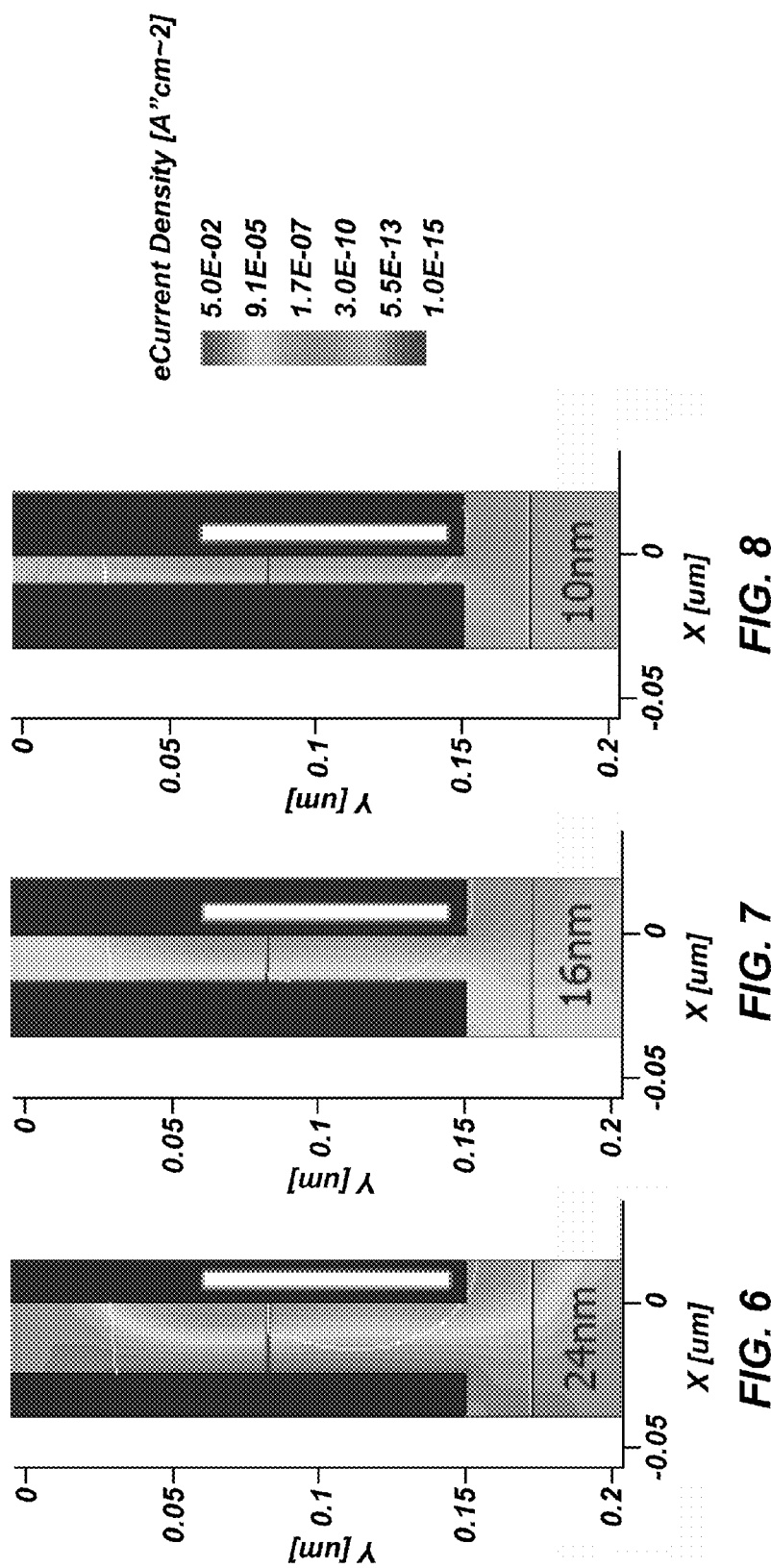

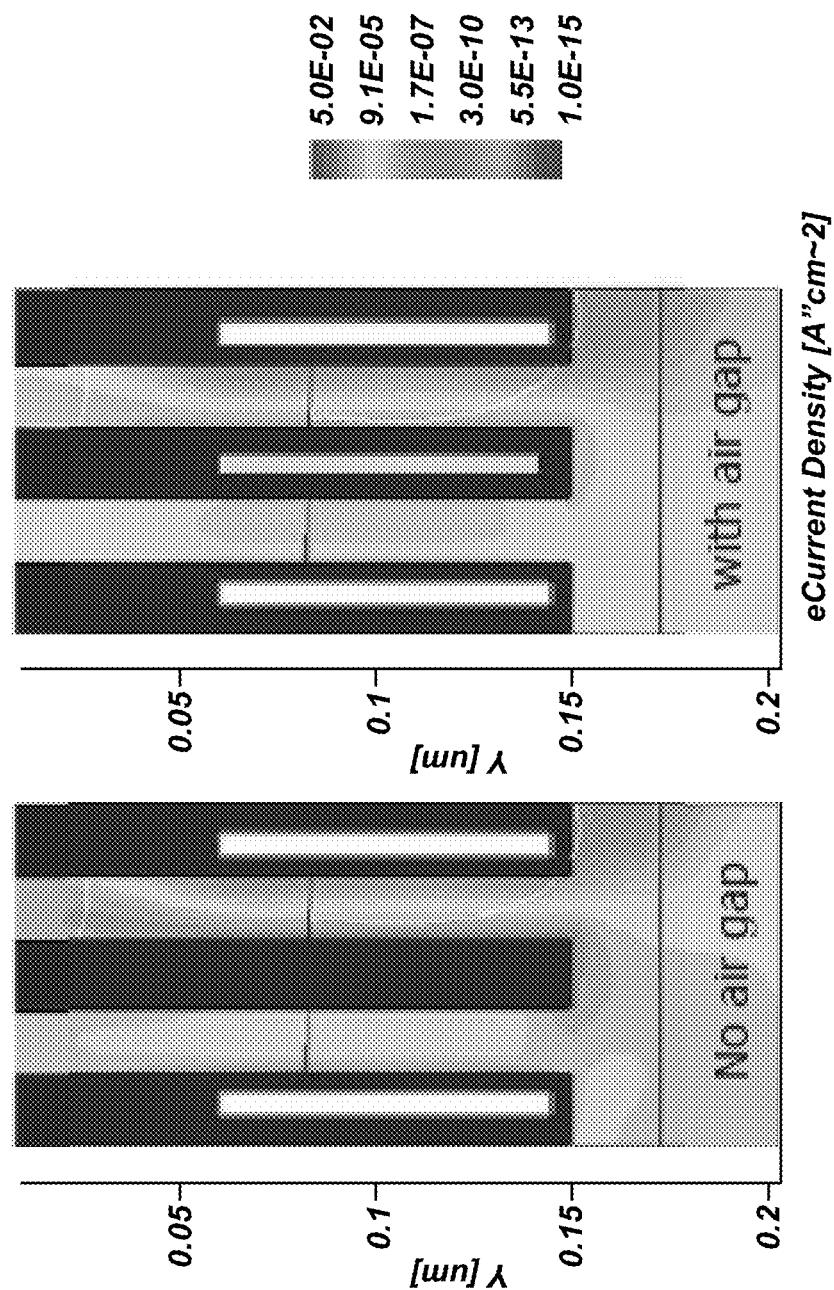

VERTICAL ACCESS DEVICES, SEMICONDUCTOR DEVICE STRUCTURES, AND RELATED METHODS

TECHNICAL FIELD

Embodiments of the disclosure relate to the field of semiconductor device design and fabrication. More specifically, embodiments of the present disclosure relate to vertical access devices, to semiconductor device structures, and to methods of forming vertical access devices and semiconductor device structures.

BACKGROUND

Integrated circuit designers often desire to increase the level of integration or density of elements within an integrated circuit by reducing the size of the individual elements and by reducing the separation distance between neighboring elements. In addition, integrated circuit designers often desire to design architectures that are not only compact, but offer performance advantages, as well as simplified designs.

A relatively common integrated circuit device is a memory device. A memory device may include a memory array having a number of memory cells arranged in a grid pattern. One type of memory cell is a dynamic random access memory (DRAM). In the simplest design configuration, a DRAM cell includes one access device, such as a transistor, and one memory storage structure, such as a capacitor. Modern applications for semiconductor devices can utilize vast numbers of DRAM unit cells, arranged in an array of rows and columns. The DRAM cells are electrically accessible through digit lines and word lines arranged along the rows and columns of the array.

DRAM access devices typically comprise a channel region between a pair of source/drain regions, and a gate configured to electrically connect the source/drain regions to one another through the channel region. Access devices that have channel regions that are primarily parallel to a primary surface of a semiconductor substrate are referred to as planar access devices (e.g., planar transistors), and those having channel regions that are generally perpendicular to the primary surface of the substrate are referred to as vertical access devices (e.g., vertical transistors). Planar access devices can be distinguished from vertical access devices based upon the direction of current flow as well as on the general orientation of the channel region. Current flow between the source and drain regions of a vertical access device is primarily substantially orthogonal to a primary surface of the semiconductive substrate or base thereunder, and current flow between source and drain regions of a planar access device is primarily parallel to the primary surface of the semiconductive substrate or base thereunder. There is continuing interest in the development of methodologies by which vertical access devices can be incorporated into integrated circuitry applications due to, among other things, advantages in packing density that can be obtained utilizing vertical access devices relative to planar access devices.

Double-gate vertical access devices have been developed for next-generation 4 $F^2$ DRAM cells (i.e., where "F" represents minimum lithographic feature width). Such vertical double-gate vertical access devices typically include a single, unitary semiconductor pillar (e.g., fin) vertically protruding from an active surface of the semiconductor substrate or base. A conductive material may be deposited over a central portion of the semiconductor pillar and patterned to form a pair of gates, serving as word lines, on opposite sides of the semiconductor pillar. However, difficulties are frequently encountered in producing the vast arrays of double-gate vertical access devices desired for semiconductor DRAM applications while maintaining suitable performance characteristics of the devices. For example, DRAM manufacturers face a tremendous challenge on shrinking the memory cell area as the word line spacing, i.e., the spacing between two adjacent word lines, continues to shrink. The shrinking spacing between two closely arranged word lines leads to undesirable electrical coupling effects for high-speed DRAM applications, and also leads to an increase in pattern noise.

It would, therefore, be desirable to have improved vertical access devices and semiconductor device structures facilitating higher packing densities with minimal electrical coupling effects and pattern noise, as well as methods of forming such vertical access devices and semiconductor device structures.

BRIEF DESCRIPTION OF THE SEVERAL VIEWS OF THE DRAWINGS

FIGS. 6 through 8 are contour plots of the results described in Example 1.

FIGS. 11 and 12 are contour plots of the results described in Example 2.

DETAILED DESCRIPTION

Figure 1A:
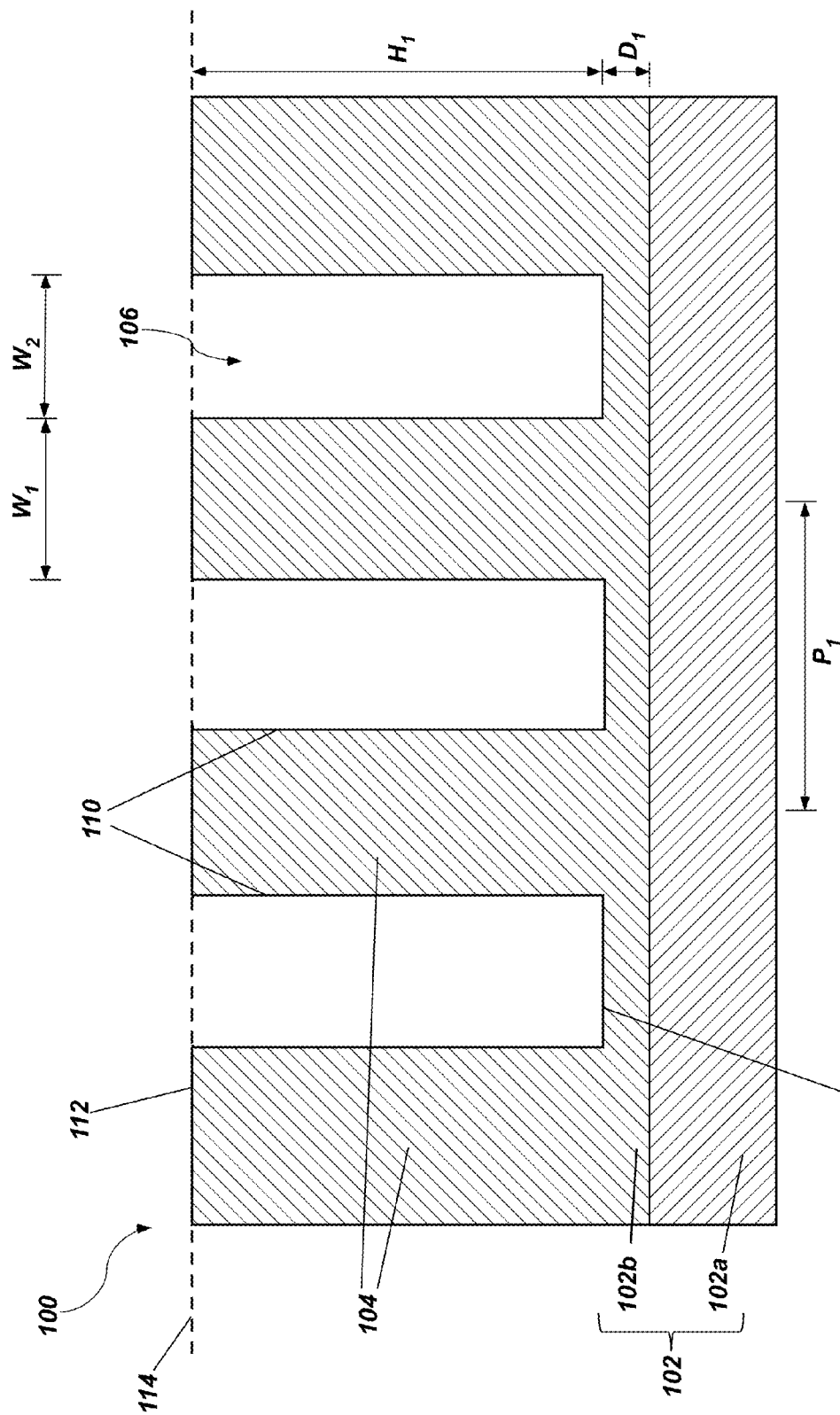
FIGS. 1A through 1I are partial cross-sectional views illustrating different process stages and structures for a method of forming a semiconductor device structure in accordance with embodiments of the disclosure.

Vertical access devices are disclosed, as are semiconductor device structures, and methods of forming vertical access devices and semiconductor device structures. In some embodiments, a vertical access device includes a semiconductive pillar extending vertically from a semiconductive base. The semiconductive base may include a lower region functioning as a source/drain region and as a digit line. The semiconductive pillar may include a channel region overlying the semiconductive base, and another source/drain region overlying the channel region. A single gate electrode may be associated with the semiconductive pillar, such that a first sidewall of the semiconductive pillar is adjacent the gate electrode while a second, opposing sidewall of the semiconductive pillar is not adjacent the gate electrode or another gate electrode. Multiple vertical access devices may be provided into an array of vertical access devices, wherein adjacent vertical access devices of the array are separated from one another by isolation structures. The dimensions and spacing of components of the vertical access devices and the isolation structures may be tailored to achieve high packing densities and improve one or more electrical properties (e.g., electrical coupling effects, shorts margins, short channel effects, access device cross talk) relative to conventional access device arrays. Body contacts may also be provided in isolation trenches between the vertical access devices to suppress (e.g., eliminate) floating body effects. The methods and structures of the disclosure may facilitate increased performance in semiconductor device structures (e.g., DRAM cells) and semiconductor devices (e.g., DRAM devices) that rely on high packing density.

As used herein, the singular forms "a," "an," and "the" are intended to include the plural forms as well, unless the context clearly indicates otherwise.

As used herein, relational terms, such as "first," "second," "top," "bottom," "upper," "lower," "over," "under," etc., are used for clarity and convenience in understanding the disclosure and accompanying drawings and do not connote or depend on any specific preference, orientation, or order, except where the context clearly indicates otherwise.

As used herein, the term "substantially," in reference to a given parameter, property, or condition, means to a degree that one of ordinary skill in the art would understand that the given parameter, property, or condition is met with a small degree of variance, such as within acceptable manufacturing tolerances.

The following description provides specific details, such as material types, material thicknesses, and processing conditions in order to provide a thorough description of embodiments of the disclosure. However, a person of ordinary skill in the art will understand that the embodiments of the present disclosure may be practiced without employing these specific details. Indeed, the embodiments of the present disclosure may be practiced in conjunction with conventional fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the disclosure are described in detail below. Additional acts to from the complete semiconductor device from the semiconductor device structures may be performed by conventional fabrication techniques. Also note, any drawings accompanying the present application are for illustrative purposes only, and are thus not drawn to scale. Additionally, elements common between figures may retain the same numerical designation.

FIGS. 1A through 1I are simplified partial cross-sectional views illustrating embodiments of a method of forming a semiconductor device structure including a vertical access device (e.g., a vertical access array transistor). With the description as provided below, it will be readily apparent to one of ordinary skill in the art that the process described herein may be used in various applications. In other words, the process may be used whenever it is desired to form a semiconductor device structure in which higher packaging densities are desired.

Referring to FIG. 1A, a semiconductor device structure 100 may include a semiconductive base 102, first semiconductive pillars 104, and first isolation trenches 106. The semiconductive base 102 and the first semiconductive pillars 104 may each be formed of and include a semiconductive material including, but not limited to, at least one of a silicon material, a silicon-germanium material, a germanium material, a gallium arsenide material, a gallium nitride material, and an indium phosphide material. In some embodiments, the semiconductive base 102 and the first semiconductive pillars 104 are formed of and include at least one silicon material. As used herein, the term "silicon material" means and includes a material that includes elemental silicon or a compound of silicon. The semiconductive base 102 and the first semiconductive pillars 104 may, for example, be formed of and include monocrystalline silicon, polysilicon, or combinations thereof.

The semiconductive base 102 may include a lower region 102a, and an upper region 102b overlying the lower region 102a. The upper region 102b may vertically extend a depth $D_1$ below an upper surface 108 of the semiconductive base 102. By way of non-limiting example, the depth $D_1$ of the upper region 102b may be greater than or equal to about 20 nanometers (nm). The lower region 102a may comprise a remaining portion of the semiconductive base 102 (i.e., a portion of the semiconductive base 102 not occupied by the upper region 102b). As described in further detail below, the lower region 102a of the semiconductive base 102 may serve as both a buried digit line and as a source/drain region of a subsequently formed vertical access device. The lower region 102a of the semiconductive base 102 is electrically coupled to the first semiconductive pillars 104 thereover, and exhibits a different conductivity type than the upper region 102b. As a non-limiting example, the lower region 102a may exhibit an N-type conductivity, and the upper region 102b may exhibit a P-type conductivity. The lower region 102a may, for example, include at least one N-type dopant (e.g., arsenic ions, phosphorous ions, antimony ions) and the upper region 102b may include at least one P-type dopant (e.g., boron ions). As another non-limiting example, the lower region 102a may exhibit a P-type conductivity, and the upper region 102b may exhibit an N-type conductivity. The lower region 102a may, for example, include at least one P-type dopant (e.g., boron ions) and the upper region 102b may include at least one N-type dopant (e.g., arsenic ions, phosphorous ions). In some embodiments, the lower region 102a exhibits N-type conductivity and the upper region 102b exhibits P-type conductivity.

The first semiconductive pillars 104 may vertically extend from and be integral with the upper region 102b of the semiconductive base 102. As used herein, each of the terms "vertical" and "longitudinal" means and includes extending in a direction substantially perpendicular to the semiconductive base 102, regardless of the orientation of the semiconductive base 102. As used herein, each of the terms "horizontal" and "lateral" means and includes extending in a direction substantially parallel to the semiconductive base 102, regardless of the orientation of the semiconductive base 102. Each of the first semiconductive pillars 104 may include opposing sidewalls 110 and an upper surface 112. The upper surfaces 112 of the first semiconductive pillars 104 may share a common plane 114, depicted as a dotted line in FIG. 1A (i.e., the upper surfaces 112 of the first semiconductive pillars 104 may be substantially coplanar with one another). The number of first semiconductive pillars 104 may be varied as desired. While various embodiments herein describe the semiconductor device structure 100 as including multiple first semiconductive pillars 104 (i.e., more than one first semiconductive pillars 104) vertically extending from the semiconductive base 102, the semiconductor device structure 100 may, alternatively, include a single first semiconductive pillar 104 vertically extending from the semiconductive base 102. The first semiconductive pillars 104 may be separated from one another by the first isolation trenches 106. The first isolation trenches 106 vertically extend to the upper surface 108 of the semiconductive base 102.

Each of the first semiconductive pillars 104 may exhibit a conductivity type substantially similar to the conductivity type of the upper region 102b of the semiconductive base 102. For example, if the upper region 102b of the semiconductive base 102 exhibits a P-type conductivity, each of the first semiconductive pillars 104 may also exhibit a P-type conductivity. Alternatively, if the upper region 102b of the semiconductive base 102 exhibits an N-type conductivity, each of the first semiconductive pillars 104 may also exhibit an N-type conductivity. In some embodiments, the upper region 102b of the semiconductive base 102 and the first semiconductive pillars 104 each exhibit a P-type conductivity, and the lower region 102a of the semiconductive base 102 exhibits an N-type conductivity.

Each of the first semiconductive pillars 104 may exhibit substantially the same dimensions and spacing. For example, each of the first semiconductive pillars 104 may exhibit substantially the same length, width $W_1$, and height $H_1$. The height $H_1$ of each of the first semiconductive pillars 104 corresponds to the depth of each of the first isolation trenches 106. Furthermore, the first semiconductive pillars 104 may be regularly spaced by a distance equal to the width $W_2$ of each of the first isolation trenches 106. In additional embodiments, at least one of the first semiconductive pillars 104 may have at least one different dimension (e.g., length, width $W_1$, height $H_1$) than at least one other of the first semiconductive pillars 104, and/or the spacing between at least one pair of neighboring first semiconductive pillars 104 may be different than the spacing between at least one other pair of neighboring first semiconductive pillars 104. The dimensions and spacing of the first semiconductive pillars 104 may be selected to provide desired dimensions and spacing to one or more subsequently formed structures (e.g., spacers, access lines (e.g., word lines), second semiconductive pillars, second isolation trenches), as described in further detail below. For example, the length and the width $W_1$ of each of the first semiconductive pillars 104 may be selected to facilitate the formation of other semiconductive pillars exhibiting smaller dimensions and decreased pitch relative to the first semiconductive pillars 104, as described in further detail below. As used herein, the term "pitch" means and includes the distance between identical points in two neighboring features.

By way of non-limiting example, each of the first semiconductive pillars 104 may have a width $W_1$ of about 1.2 F and a length of about 1.2 F, where F is the minimum realizable feature dimension (i.e., about half of the minimum pitch, 2 F) of the first semiconductive pillars 104. Due to optical factors, such as lens limitations and light or radiation wavelength, conventional photolithographic pattern techniques have minimum pitches, 2 F, below which a particular photolithographic technique cannot reliably form features. Accordingly, a pitch $P_1$ of neighboring first semiconductive pillars 104 may be about 2 F. The width $W_2$ of each of the first isolation trenches 106 (i.e., corresponding to the distance between neighboring first semiconductive pillars 104) may be about 0.8 F. The height $H_1$ of each of the first semiconductive pillars 104 may be greater than or equal to about 5 times (5×) the width $W_1$ of each of the first semiconductive pillars 104, such as greater than or equal to about 10 times (10×) the width $W_1$, or greater than or equal to about 20 times (20×) the width $W_1$. In some embodiments, the length and the width $W_1$ of each of the first semiconductive pillars 104 are each about 30 nm, the pitch $P_1$ of neighboring first semiconductive pillars 104 is about 50 nm, the width $W_2$ of each of the first isolation trenches 106 is about 20 nm, and the height $H_1$ of each of the first semiconductive pillars 104 is greater than or equal to about 150 nm.

The semiconductive device structure 100, including the semiconductive base 102, the first semiconductive pillars 104, and the first isolation trenches 106 may be formed using conventional processes and conventional processing equipment, which are not described in detail herein. By way of non-limiting example, a semiconductive material may be conventionally formed (e.g., through at least of in situ growth, spin-on coating, blanket coating, chemical vapor deposition, plasma enhanced chemical vapor deposition, atomic layer deposition, and physical vapor deposition), doped (e.g., through ion-implantation), and patterned (e.g., masked, photoexposed, developed, and etched) to form the semiconductive device structure 100.

Figure 1B:
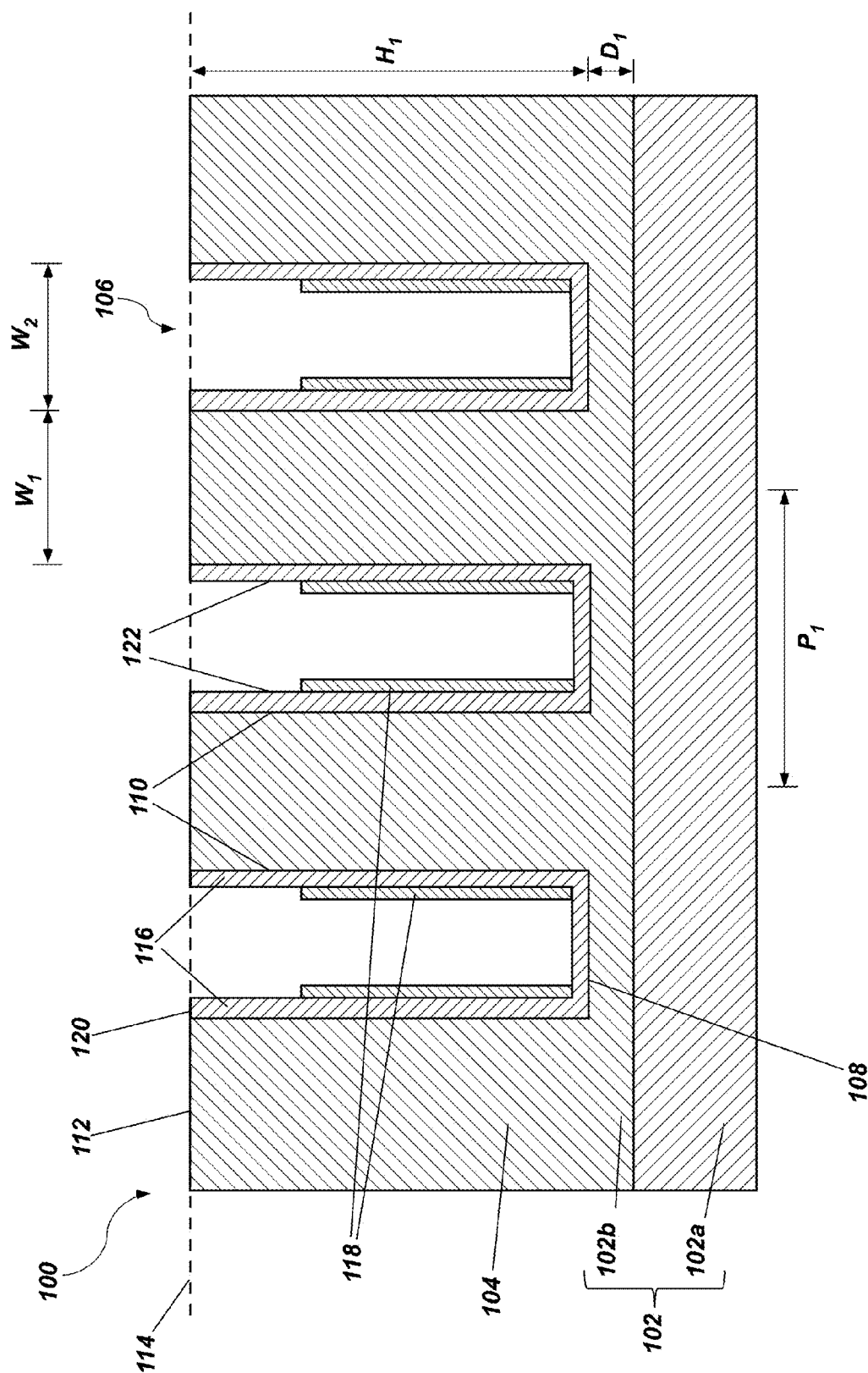

Referring to FIG. 1B, a gate dielectric material 116 may be formed on or over surfaces within the first isolation trenches 106, and gate electrodes 118 may be formed on or over surfaces of the gate dielectric material 116. As depicted in FIG. 1B, the gate dielectric material 116 may be conformally formed on or over the opposing sidewalls 110 of each of the first semiconductive pillars 104, and on or over the upper surface 108 of the semiconductive base 102 exposed within the first isolation trenches 106. In additional embodiments, the gate dielectric material 116 on or over one or more surfaces within the first isolation trenches 106 may, optionally, be omitted (e.g., such that the gate electrodes 118 are formed on at least one of the opposing sidewalls 110 of the first semiconductive pillars 104 and the upper surface 108 of the semiconductive base 102). The gate dielectric material 116 within each of the first isolation trenches 106 may be substantially confined within the horizontal boundaries and the vertical boundaries of each of the first isolation trenches 106. Accordingly, an upper surface 120 of the gate dielectric material 116 within each of the first isolation trenches 106 may be substantially coplanar with the plane 114 shared by the upper surface 112 of each of the first semiconductive pillars 104.

The gate dielectric material 116 may be formed of and include an oxide material (e.g., silicon dioxide, phosphosilicate glass, borosilicate glass, borophosphosilicate glass, fluorosilicate glass, aluminum oxide, a combination thereof), a nitride material (e.g., silicon nitride), an oxynitride material (e.g., silicon oxynitride), amphorous carbon, or a combination thereof. In some embodiments, the gate dielectric material 116 is silicon dioxide. The gate dielectric material 116 may be formed at any suitable thickness. The thickness of the gate dielectric material 116 may be selected (e.g., tailored) to provide a desired horizontal offset (e.g., space, distance) between the gate electrodes 118 and the first semiconductive pillars 104 adjacent thereto, and to provide a desired vertical offset (e.g., space, distance) between the gate electrodes 118 and the semiconductive base 102 thereunder. By way of non-limiting example, the thickness of the gate dielectric material 116 may be less than or equal to about 1 nm, less than or equal to about 50 Angstroms (Å), less than or equal to about 25 Å, or less than or equal to about 10 Å. In some embodiments, the thickness of the gate dielectric material 116 is within a range of from about 5 Å to about 10 Å. The thickness of the gate dielectric material 116 may be substantially uniform, or at least one region of the gate dielectric material 116 (e.g., a region extending across the upper surface 108 of the semiconductive base 102) may have a different thickness than at least one other region of the gate dielectric material 116 (e.g., regions extending across the opposing sidewalls 110 of neighboring first semiconductive pillars 104).

The gate electrodes 118 may be formed on or over the opposing sidewalls 110 of each of the first semiconductive pillars 104. For example, the gate electrodes 118 may be formed on or over opposing side surfaces 122 of the gate dielectric material 116 within the first isolation trenches 106. Accordingly, the first semiconductive pillars 104 may be considered to be "double-gated" in that the gate electrodes 118 are formed on or over the opposing sidewalls 110 of each of the first semiconductive pillars 104 (e.g., on the gate dielectric material 116 formed on or over the opposing sidewalls 110 of each first semiconductive pillars 104). Put another way, each of the first semiconductive pillars 104 may be disposed laterally between (e.g., flanked by) a pair of neighboring gate electrodes 118. The gate electrodes 118 may serve as word lines, and may extend in a direction substantially perpendicular to that of the lower region 102a (i.e., which may serve as a digit line) of the semiconductive base 102.

The gate electrodes 118 may be formed of and include an electrically conductive material including, but not limited to, a metal (e.g., tungsten, titanium, nickel, platinum, gold), a metal alloy, a metal-containing material (e.g., metal nitrides, metal silicides, metal carbides, metal oxides), a conductively-doped semiconductor material (e.g., conductively-doped silicon, conductively-doped germanium, conductively-doped silicon germanium, etc.), or combinations thereof. By way of non-limiting example, the gate electrodes 118 may comprise at least one of titanium nitride (TiN), tantalum nitride (TaN), tungsten nitride (WN), titanium aluminum nitride (TiAlN), elemental titanium (Ti), elemental platinum (Pt), elemental rhodium (Rh), elemental iridium (Ir), iridium oxide (IrO$_x$), elemental ruthenium (Ru), ruthenium oxide (RuO$_x$), alloys thereof, or combinations thereof. In some embodiments, the gate electrodes 118 are formed of TiN. The gate electrodes 118 may each be formed to have any desired dimensions (e.g., length, width, height). By way of non-limiting example, the gate electrodes 118 may each have a width within a range of from about 1 nm to about 30 nm (e.g., from about 5 nm to about 20 nm, or from about 5 nm to about 10 nm), and a height within a range of from about 5 nm to about 100 nm (e.g., from about 10 nm to about 50 nm, or from about 20 nm to about 30 nm). In some embodiments, the gate electrodes 118 on or over the opposing sidewalls 110 of a first semiconductive pillar 104 each have a height greater than or equal to about two times (2×) the width $W_1$ of the first semiconductive pillar 104.

The gate dielectric material 116 and the gate electrodes 118 may each independently be formed within the first isolation trenches 106 using conventional processes (e.g., deposition processes, such as at least one of atomic layer deposition processes, chemical vapor deposition processes, and physical vapor deposition processes; thermal growth processes, such as at least one of furnace oxidation processes, and a radical oxidation processes; and material removal processes, such as at least one of chemical mechanical planarization processes, masking processes, and etching processes) and conventional processing equipment, which are not described in detail herein.

Figure 1C:
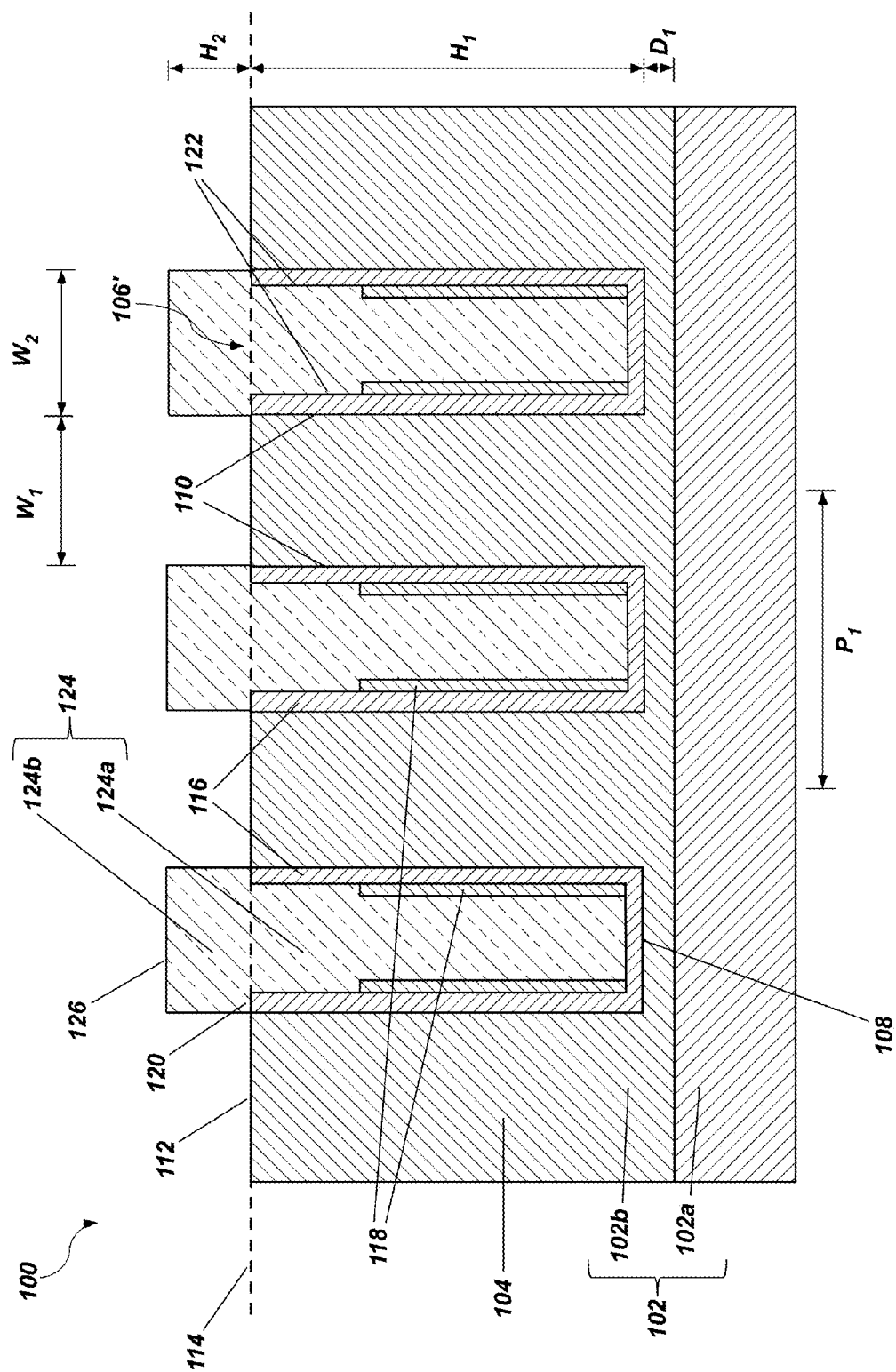

Referring next to FIG. 1C, first isolation structures 124 may be formed in the first isolation trenches 106 (FIG. 1B). A lower portion 124a of each of the first isolation structures 124 may be formed on or over exposed surfaces of the gate dielectric material 116 and the gate electrodes 118 within each of the first isolation trenches 106, and may fill a remaining portion of each of the first isolation trenches 106 (e.g., portions of the first isolation trenches 106 not occupied by the gate dielectric material 116 and the gate electrodes 118) to form first filled isolation trenches 106'. An upper portion 124b of each of the first isolation structures 124 may protrude (e.g., extend) a height $H_2$ beyond vertical boundaries of each of the first filled isolation trenches 106' (e.g., beyond the plane 114 shared by the upper surface 112 of each of the first semiconductive pillars 104). Accordingly, an upper surface 126 of each of the first isolation structures 124 may be substantially non-coplanar with the plane 114 shared by the upper surface 112 of each of the first semiconductive pillars 104. As a non-limiting example, the height $H_2$ of the upper portion 124b of each of the first isolation structures 124 may be within a range of from about 5 nm to about 50 nm, such as from about 10 nm to about 40 nm, or from about 20 nm to about 30 nm. Each of the first isolation structures 124 (i.e., including the lower portion 124a and the upper portion 124b thereof) may be confined within horizontal boundaries of each of the first filled isolation trenches 106'. As shown in FIG. 1C, the upper portion 124b of each of first isolation structures 124 may have substantially the same width $W_2$ as the first filled isolation trench 106' associated therewith (e.g., thereunder).

The first isolation structures 124 may be formed of and include a dielectric material, such as an oxide material (e.g., silicon dioxide, phosphosilicate glass, borosilicate glass, borophosphosilicate glass, fluorosilicate glass, aluminum oxide, a combination thereof), a nitride material (e.g., silicon nitride), an oxynitride material (e.g., silicon oxynitride), amphorous carbon, or a combination thereof. The dielectric material of the first isolation structures 124 may be the same as or different than that of the gate dielectric material 116. In some embodiments, each of the first isolation structures 124 is formed of and includes a silicon oxide (e.g., silicon dioxide).

The first isolation structures 124 may be formed using conventional processes (e.g., deposition processes, photolithographic patterning processes, material removal processes) and conventional processing equipment, which are not described in detail herein. For example, a dielectric material may be formed (e.g., deposited) over and between the first semiconductive pillars 104, and portions of the dielectric material overlying the upper surfaces 112 of the first semiconductive pillars 104 may be selectively removed (e.g., through conventional photolithographic patterning and etching processes) to form the first isolation structures 124.

Figure 1D:
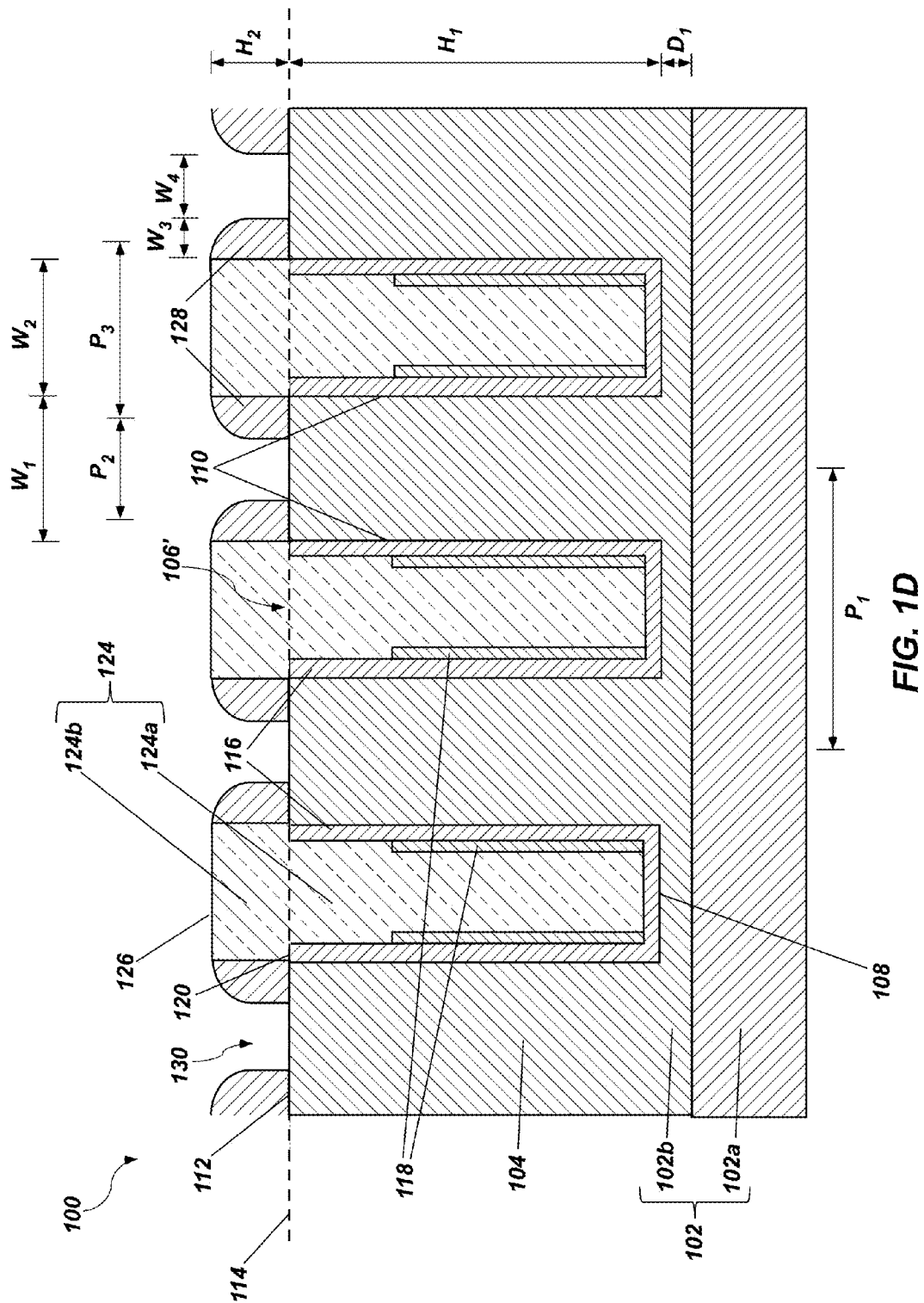

Referring to next to FIG. 1D, spacers 128 may be formed on opposing sidewalls of the upper portions 124b of the first isolation structures 124. The spacers 128 on neighboring first isolation structures 124 (e.g., a pair of first isolation structures 124 separated by a single first semiconductive pillar 104) may be separated from one another by apertures 130. As described in further detail below, the dimensions and spacing of the spacers 128 (and, hence, the dimensions and spacing of the apertures 130) may be selected to provide desired dimensions and spacing to second (e.g., additional) semiconductive pillars to be formed from the first semiconductive pillars 104 using the spacers 128.

Each of the spacers 128 may have substantially the same dimensions (e.g., width, length, and height). In addition, each of the apertures 130 may have substantially the same dimensions (e.g., width, length, and height). The dimensions of each of the spacers 128 may be the same as the dimensions of each of the apertures 130, or the dimensions of at least one of the spacers 128 may be different than the dimensions of at least one of the apertures 130. A width $W_3$ of each of the spacers 128 may be selected based on a desired width of second semiconductive pillars to be formed using the spacers 128 (e.g., using the spacers 128 as an etching mask). In turn, a width $W_4$ of each of the apertures 130 (i.e., corresponding to the distance between spacers 128 overlying a single first semiconductive pillar 104) may be selected based on a desired spacing (e.g., distance) between a pair of neighboring second semiconductive pillars to be formed from a single first semiconductive pillar 104. A pitch $P_2$ of neighboring spacers 128 overlying a single first semiconductive pillar 104 depends on the width $W_3$ of each of the neighboring spacers 128 and the width $W_4$ of each of the apertures 130. Neighboring spacers 128 overlying neighboring first semiconductive pillars 104 (e.g., on opposing sidewalls of the upper portion 124b of a single first isolation structure 124) may be separated from one another by the width $W_2$ of the upper portion 124b of the first isolation structure 124 therebetween. A pitch $P_3$ of neighboring spacers 128 overlying neighboring first semiconductive pillars 104 depends on the width $W_3$ of each of the neighboring spacers 128 and the width $W_2$ of each of the upper portion 124b of the first isolation structure 124 therebetween. In addition, each of the spacers 128 may have substantially the same height $H_2$ as the upper portion 124b of the first isolation structure 124 laterally adjacent thereto.

By way of non-limiting example, the width $W_3$ of each of the spacers 128 may be about 0.4 F (e.g., about 30 percent of the width $W_1$ of the first semiconductive pillar 104 thereunder), the width $W_4$ of each of the apertures 130 may be about 0.4 F (e.g., about 30 percent of the width $W_1$ of the first semiconductive pillar 104 thereunder), a pitch $P_2$ of neighboring spacers 128 overlying a single first semiconductive pillar 104 may be about 0.8 F (e.g., about 66 percent of the width $W_1$ the first semiconductive pillar 104 thereunder), the width $W_2$ separating neighboring spacers 128 overlying neighboring first semiconductive pillars 104 may be about 0.8 F (e.g., about 66 percent of the width $W_1$ of each of the neighboring first semiconductive pillars 104 thereunder), and a pitch $P_3$ of neighboring spacers 128 overlying neighboring first semiconductive pillars 104 may be about 1.2 F (e.g., about 100 percent of the width $W_1$ of each of the neighboring first semiconductive pillars 104 thereunder). In some embodiments, the width $W_3$ of each of the spacers 128 is each about 10 nm, the width $W_4$ of each of the apertures 130 is about 10 nm, the pitch $P_2$ of neighboring spacers 128 overlying a single first semiconductive pillar 104 is about 20 nm, and the pitch $P_3$ of neighboring spacers 128 overlying neighboring first semiconductive pillars 104 is about 30 nm.

Each of the spacers 128 may be formed of and include a material suitable for use as a mask for selectively removing (e.g., etching, such as anisotropically dry etching) portions of the first semiconductive pillars 104. By way of non-limiting example, each of the spacers 128 may be formed of and include a nitride material (e.g., a metal nitride, such as tantalum nitride, titanium nitride, hafnium nitride, or silicon nitride), an oxide material (e.g., a metal oxide, such as silicon oxide), an oxynitride material (e.g., a metal oxynitride, such as silicon oxynitride), or a carbide material (e.g., silicon carbide). In some embodiments, each of the spacers 128 is formed of and includes tantalum nitride (TaN) or titanium nitride (TiN).

A pitch density multiplication process may be utilized to form the spacers 128 using the upper portions 124b of the first isolation structures 124. For example, referring collectively to FIGS. 1C and 1D, a spacer material may be conformally formed (e.g., deposited using a PVD process, a CVD process, an ALD process, or a spin-coating process) over exposed surfaces of the first semiconductive pillars 104 and the upper portions 124b of the first isolation structures 124. A thickness of the spacer material may correspond to the width $W_3$ of the spacers 128 to be formed. An anisotropic etching process may then be performed to remove the spacer material from the upper surface 126 of each of the first isolation structures 124 and from a portion of the upper surface 112 of each of the first semiconductive pillars 104, while maintaining the spacer material on opposing sidewalls of the upper portions 124b of the first isolation structures 124 to form the spacers 128.

Figure 1E:
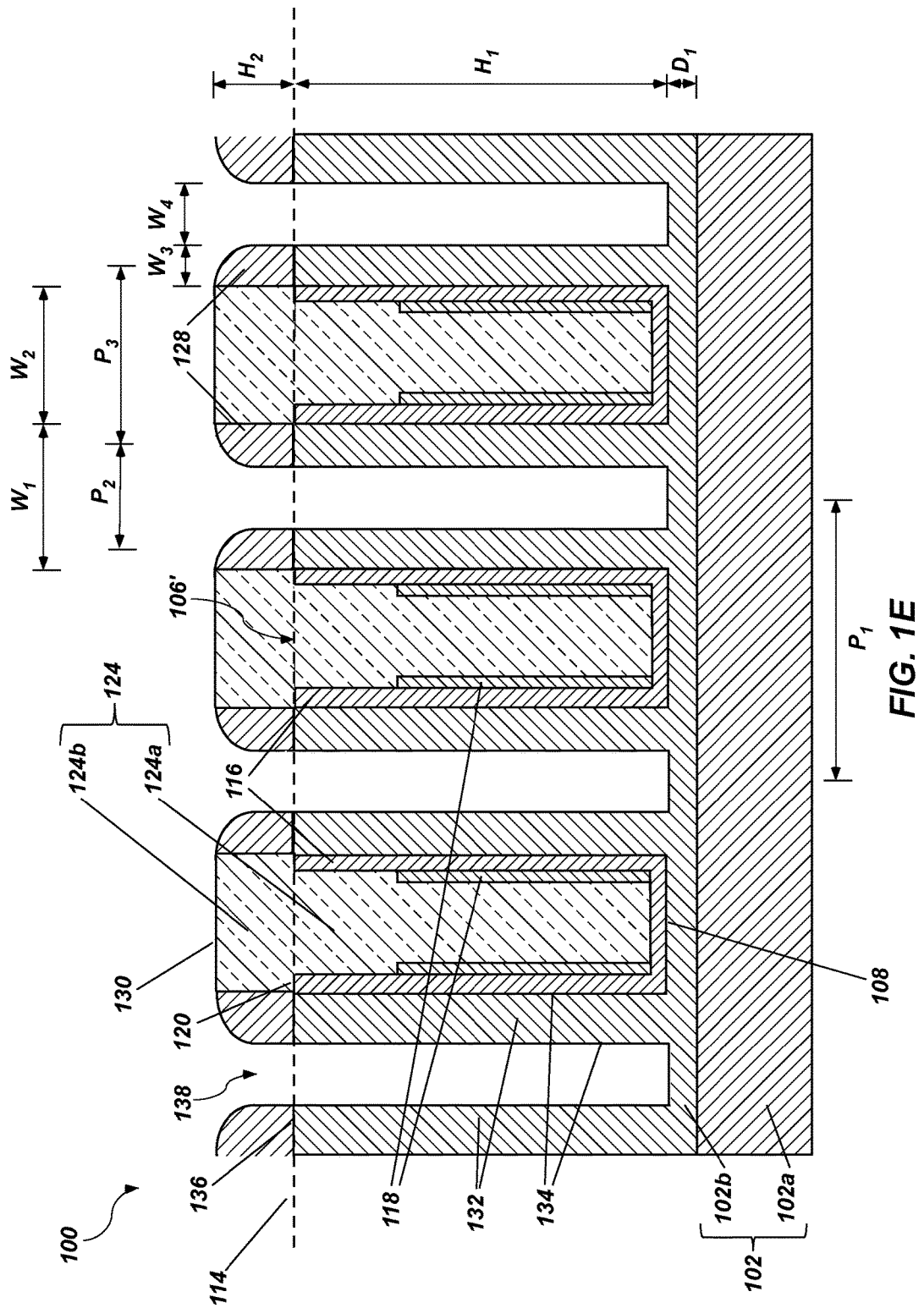

Referring to FIG. 1E, the apertures 130 (FIG. 1D) between the spacers 128 may be vertically extended into the first semiconductive pillars 104 (FIG. 1D) to form second semiconductive pillars 132. For example, the spacers 128 may be used as a mask to aid in the removal of (e.g., etch) material from a portion (e.g., a central portion) of each of the first semiconductive pillars 104 to form a pair of second semiconductive pillars 132 from each of the first semiconductive pillars 104. The second semiconductive pillars 132 may function as fins or pillars of single-gate vertical access devices, as described in further detail below. Each of the second semiconductive pillars 132 may include opposing sidewalls 134 and an upper surface 136. The upper surfaces 136 of the second semiconductive pillars 132 may share the same common plane 114 previously shared by the first semiconductive pillars 104 (FIG. 1D) (i.e., the upper surfaces 136 of the second semiconductive pillars 132 may be substantially coplanar with one another). In addition, a bottom of each of the second isolation trenches 134 may be substantially coplanar with the upper surface 108 of the semiconductive base 102 (i.e., which is also coplanar with the bottom of the first isolation trenches 106 shown in FIG. 1A). In additional embodiments, a bottom of at least one of the second isolation trenches 134 may be substantially non-coplanar with the upper surface 108 of the semiconductive base 102.

The dimensions and spacing of the second semiconductive pillars 132 may be selected (e.g., tailored) at least partially based on the material, dimensions, and spacing of at least one of the first isolation structures 124, second isolation structures to be formed in the second isolation trenches 138 (see below), the gate dielectric material 116, and the gate electrodes 118. For example, the dimensions and location of the second semiconductive pillars 132 may be selected, in conjunction with the material, dimensions, and spacing of each of the first isolation structures 124, the second isolation structures to be formed in second isolation trenches 138, the gate dielectric material 116, and the gate electrodes 118, to limit capacitance and increase shorts margin between the gate electrodes 118 of neighboring vertical access devices to be subsequently formed (see below), to reduce cross-talk between the neighboring vertical access devices, and to reduce short channel effects of the vertical access devices. Each of the second semiconductive pillars 132 may exhibit substantially the same dimensions.

As depicted in FIG. 1E, the second semiconductive pillars 132 may have substantially the same width $W_3$ (e.g., about 0.4 F) and length (e.g., about 0.4 F) as the spacers 128 thereover, and may have substantially the same height $H_1$ as the semiconductive structures 104 (FIG. 1D) from which the second semiconductive pillars 132 are formed. The second isolation trenches 138 may have substantially the same width $W_4$ (e.g., about 0.4 F) as the apertures 130 (FIG. 1D) between the spacers 128. Accordingly, second semiconductive pillars 132 formed from a single first semiconductive pillar 104 (e.g., a pair of the second semiconductive pillars 132 located between neighboring first isolation structures 124; a pair of the second semiconductive pillars 132 adjacent opposing sides of a single second isolation trench 138) may be separated from one another by the width $W_4$ (e.g., about 0.4 F), and second semiconductive pillars 132 formed from neighboring semiconductive structures 104 (e.g., a pair of the second semiconductive pillars 132 adjacent opposing sides of a single first isolation structure 124; a pair of the second semiconductive pillars 132 located between neighboring second isolation trenches 138) may be separated from one another by the width $W_2$ (e.g., about 0.8 F) of the upper portion 124b of the first isolation structures 124. In addition, second semiconductive pillars 132 formed from a single first semiconductive pillar 104 may have substantially the same pitch $P_2$ (e.g., about 0.8 F) as the neighboring spacers 128 thereover, and second semiconductive pillars 132 formed from neighboring semiconductive structures 104 may have substantially the same pitch $P_3$ (e.g., about 1.2 F) as the neighboring spacers 128 thereover. In some embodiments, the width $W_3$ of each of the second semiconductive pillars 132 is about 10 nm, the width $W_2$ of the upper portion 124b of each of the first isolation structures 124 is about 20 nm, the width $W_4$ of each of the second isolation trenches 138 is about 10 nm, the pitch $P_2$ of neighboring second semiconductive pillars 132 adjacent (e.g., flanking) opposing sides of a single second isolation trench 138 is about 20 nm, the pitch $P_3$ of neighboring second semiconductive pillars 132 adjacent (e.g., flanking) opposing sides of a single first isolation structure 124 is about 30 nm, and the height $H_1$ of each of the second semiconductive pillars 132 is greater than or equal to about 150 nm.

Only one of the opposing sidewalls 134 of each of the second semiconductive pillars 132 may be located adjacent (as separated by the gate dielectric material 116) a gate electrode 118. Put another way, a first of the opposing sidewalls 134 of each of the second semiconductive pillars 132 may abut one of the first filled isolation trenches 106' containing the gate electrodes 118, and a second of the opposing sidewalls 134 of each of the second semiconductive pillars 132 may abut one of the second isolation trenches 138 not containing (e.g., free of) the gate electrodes 118. Put yet still another way, for each of the second semiconductive pillars 132, a single gate electrode 118 may be associated with the second semiconductive pillar 132, such that a first sidewall of the second semiconductive pillar 132 is adjacent the gate electrode 118 while a second, opposing sidewall of the second semiconductive pillar 132 is not adjacent the gate electrode 118 or another gate electrode. Accordingly, each of the second semiconductive pillars 132 may be considered to be "single-gated" in that only one gate electrode 118 is adjacent thereto (i.e., rather than being adjacent to, or flanked by, two or more gate electrodes 118).

As discussed above, to form the second semiconductive pillars 132, the spacers 128 may be used as a mask for at least one material removal process (e.g., an etching process, such an anisotropic dry etching process) to remove unmasked portions (i.e., portions not underlying the spacers 128) of each of the first semiconductive pillars 104 to a desired depth.

Figure 1F:
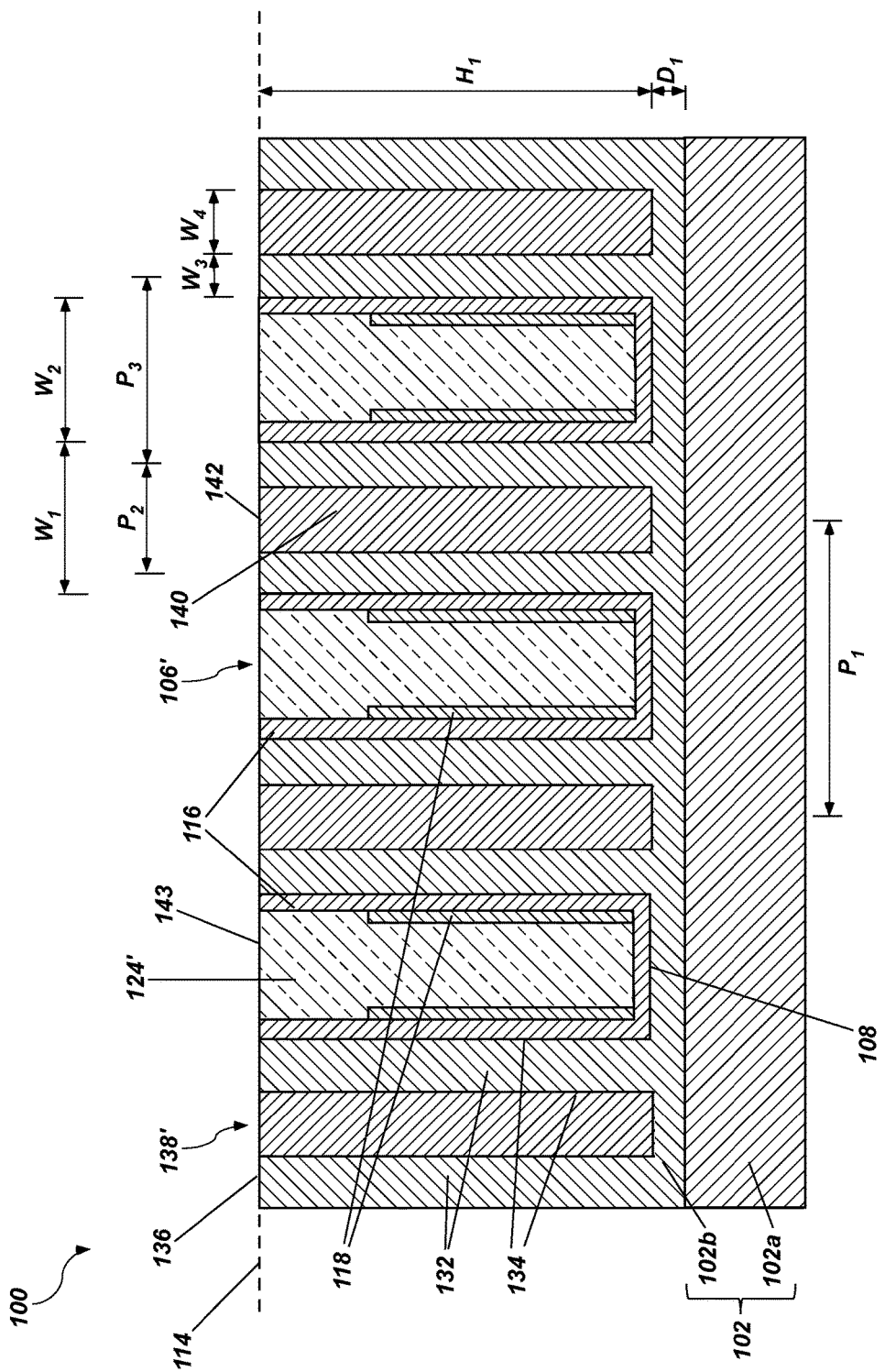

Referring next to FIG. 1F, second isolation structures 140 may be formed in the second isolation trenches 138 (FIG. 1E), and the spacers 128 (FIG. 1E) and the upper portion 124b (FIG. 1E) of the first isolation structures 124 (FIG. 1E) may be removed. The second isolation structures 140 may fill the second isolation trenches 138 to form second filled isolation trenches 138'. As depicted in FIG. IF, each of the second isolation structures 140 may be confined within horizontal boundaries and vertical boundaries of each of the second filled isolation trenches 138'. In additional embodiments, one or more of the second isolation structures 140 may extend beyond at least one of the horizontal boundaries and the vertical boundaries of one or more of the second filled isolation trenches 138'.

The second isolation structures 140 may be formed of and include a dielectric material, such as an oxide material (e.g., silicon dioxide, phosphosilicate glass, borosilicate glass, borophosphosilicate glass, fluorosilicate glass, aluminum oxide, a combination thereof), a nitride material (e.g., silicon nitride), an oxynitride material (e.g., silicon oxynitride), amphorous carbon, or a combination thereof. The dielectric material of the second isolation structures 132 may be the same as or different than that of at least one of the first isolation structures 124 and the gate dielectric material 116. In some embodiments, each of the second isolation structures 132 is formed of and includes a silicon oxide (e.g., silicon dioxide).

Conventional processes (e.g., deposition processes, growth processes, material removal processes) and conventional processing equipment may be used to form the second isolation structures 140, and to remove the spacers 128 (FIG. 1E) and the upper portion 124b (FIG. 1E) of the first isolation structures 124 (FIG. 1E), and are thus not described in detail herein. For example, a dielectric material may be formed within the second isolation trenches 138 (FIG. 1E) by at least one of a material deposition process (e.g., a spin-on coating process, a blanket coating process, a chemical vapor deposition process, a plasma enhanced chemical vapor deposition process, an atomic layer deposition process, a physical vapor deposition process), and a thermal growth process. At least one material removal process (e.g., a chemical mechanical planarization process, an etching process) may be used to remove portions of the dielectric material overlying surfaces of features outside of the second isolation trenches 138, and to remove the spacers 128 (FIG. 1E) and the upper portions 124b (FIG. 1E) of the first isolation structures 124 (FIG. 1E). As shown in FIG. 1F, upper surfaces 142 of the second isolation structures 140, and upper surfaces 143 of modified first isolation structures 124' (i.e., formed through the removal of the upper portion 124b of the first isolation structures 124) may each be substantially coplanar with (e.g., share) the plane 114 shared by the upper surfaces 136 of the second semiconductive pillars 132.

Accordingly, a semiconductor device structure of the disclosure comprises at least one semiconductive pillar vertically extending from a semiconductive base, a first filled isolation trench located on a first side of the at least one semiconductive pillar, a second filled isolation trench located on a second, opposite side of the at least one semiconductive pillar, a dielectric material on surfaces of the at least one semiconductive pillar within the first filled isolation trench, a pair of gate electrodes on surfaces of the gate dielectric material within the first filled isolation trench, a first isolation structure overlying and between surfaces of the pair of gate electrodes and the gate dielectric material within the first filled isolation trench, and a second isolation structure on surfaces of the at least one semiconductive pillar within the at least second filled isolation trench.

Furthermore, in accordance with embodiments of the disclosure, a method of forming a semiconductor device structure comprises forming first semiconductive pillars vertically extending from a semiconductive base and separated from one another by first isolation trenches. Gate electrodes are formed over opposing sidewalls of the first semiconductive pillars exposed within the first isolation trenches. First isolation structures are formed over and between the gate electrodes within the first isolation trenches. Second isolation trenches are formed in the first semiconductive pillars to form second semiconductive pillars, each of the second semiconductive pillars adjacent one of the gate electrodes. Second isolation structures are formed in the second isolation trenches.

Figure 1G:
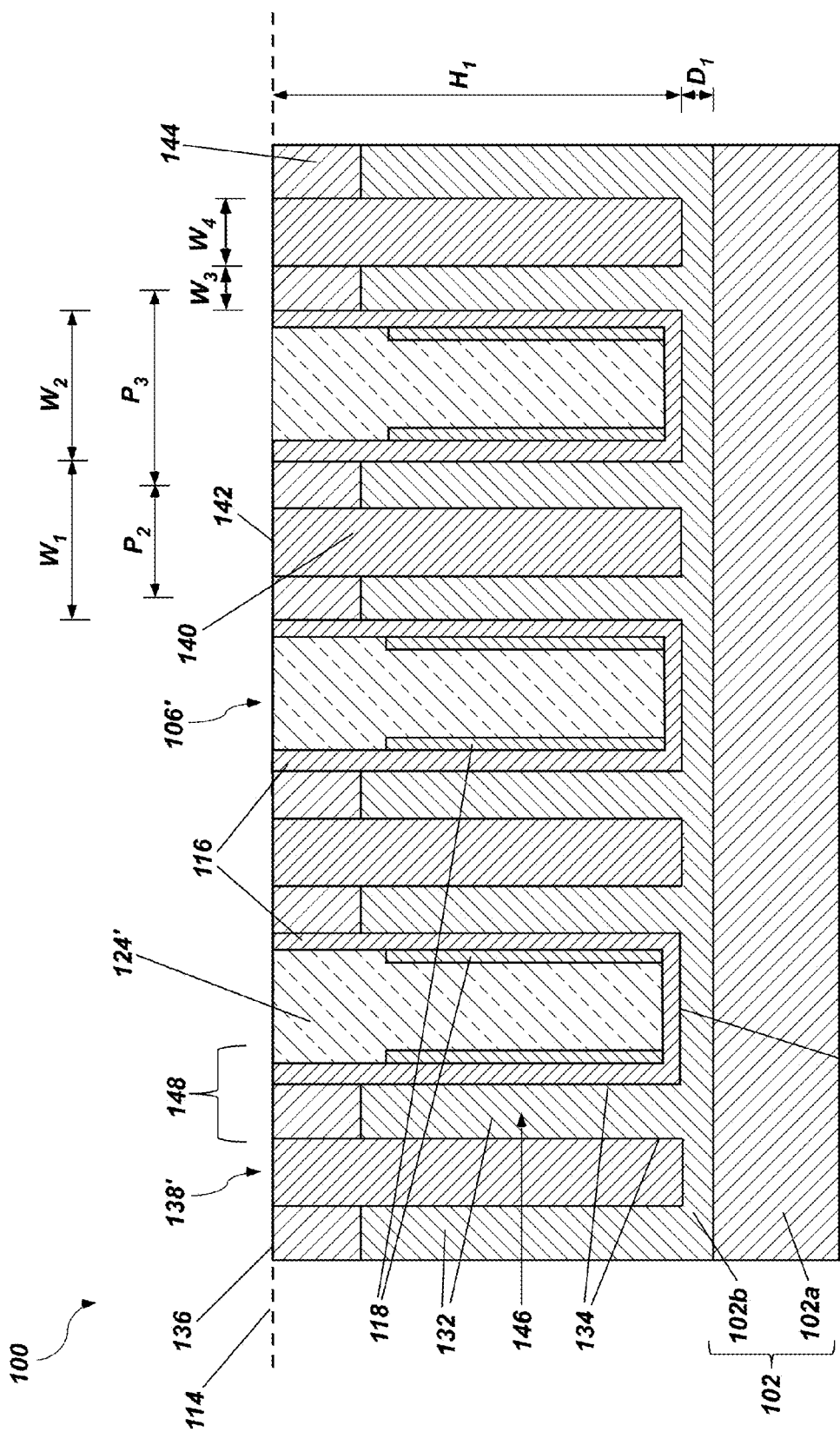

Referring to FIG. 1G, a source/drain region 144 may be formed in an upper region of each of the second semiconductive pillars 132 to form vertical access devices 148 each including the source/drain region 144, a channel region 146, a portion of the semiconductive base 102, and a single gate electrode 118. As previously discussed, the lower region 102a of the semiconductive base 102 may serve as a shared source/drain region (as well as a buried digit line) for each of the vertical access devices 148. For each of the vertical access devices 148, the source/drain region 144 vertically overlies the channel region 146, and the channel region 146 vertically overlies the lower region 102a of the semiconductive base 102. Only one of the opposing sidewalls 134 of the second semiconductive pillar 132 of each of the vertical access devices 148 is associated with (e.g., adjacent, proximate) a gate electrode 118. Put another way, a first of the opposing sidewalls 134 of the second semiconductive pillar 132 of each of the vertical access devices 148 is horizontally adjacent (as separated by the gate dielectric material 116) one of the gate electrodes 118, and a second of the opposing sidewalls 134 of the second semiconductive pillar 132 of each of the vertical access devices 148 is not horizontally adjacent (e.g., is horizontally distal from) one of the gate electrodes 118. Thus, only one side of the channel region 146 of each of the vertical access devices 148 is horizontally adjacent a gate electrode 118. Accordingly, each of the vertical access devices 148 may be considered to be single-gate vertical access devices. For each vertical access device 148, the gate electrode 118 may be positioned vertically between a bottom of the source/drain region 144 of the second semiconductive pillar 132 and a top of the lower region 102a (i.e., serving, in part, as another source/drain region) of the semiconductive base 102. As depicted in FIG. 1G, the gate electrodes 118 do not vertically overlap the source/drain region 144 of the second semiconductive pillars 132 or the lower region 102a of the semiconductive base 102. In additional embodiments, the gate electrodes 118 may vertically overlap the source/drain region 144 of one or more of the second semiconductive pillars 132.

The source/drain region 144 of each of the second semiconductive pillars 132 may exhibit substantially the same conductivity type as the lower region 102a (e.g., source/drain region) of the semiconductive base 102, and may exhibit a different conductivity type than the channel region 146 of each of the second semiconductive pillars 132. As a non-limiting example, the source/drain region 144 of each of the second semiconductive pillars 132 and the lower region 102a of the semiconductive base 102 may exhibit an N-type conductivity, and the channel region 146 of each of the second semiconductive pillars 132 may exhibit a P-type conductivity. As another non-limiting example, the source/drain region 144 of each of the second semiconductive pillars 132 and the lower region 102a of the semiconductive base 102 may exhibit a P-type conductivity, and the channel region 146 of each of the second semiconductive pillars 132 may exhibit an N-type conductivity. In some embodiments, the source/drain region 144 of each of the second semiconductive pillars 132 exhibits N-type conductivity, the channel region 146 of each of the second semiconductive pillars 132 exhibits P-type conductivity, the upper region 102b of the semiconductive base 102 exhibits P-type conductivity, and the lower region of the semiconductive base 102 exhibits N-type conductivity.

The source/drain regions 144 of the second semiconductive pillars 132 may be formed using conventional processes (e.g., an ion implantation process, a plasma implantation process, a high temperature diffusion process) and conventional processing equipment, which are not described in detail herein. For example, the source/drain regions 144 may be formed by exposing the second semiconductive pillars 132 to an N-type dopant such that an N-type material is totaled. As another example, a thin film of a highly doped N-type material may be deposited over surfaces (e.g., the upper surfaces 136) of second semiconductive pillars 132 and a thermal anneal may be performed to migrate dopants from the highly doped N-type material into the second semiconductive pillars 132 to total the source/drain regions 144. In additional embodiments, the source/drain regions 144 may be formed prior to forming the second semiconductive pillars 132, such as prior to forming the first semiconductive pillars 104 (FIG. 1A). For example, the source/drain regions 102a and 144 may be formed in a semiconductive substrate (e.g., through a deep ion implantation process and a shallow ion implantation process), and the semiconductive substrate may then be subjected to at least one material removal process (e.g., etching process) to from the first semiconductive pillars 104.

Accordingly, a vertical access device of the disclosure comprises a semiconductive base comprising a first source/drain region, a semiconductive pillar extending vertically from the semiconductive base and comprising a channel region overlying the first source/drain region and a second source/drain region overlying the channel region, and a gate electrode adjacent a sidewall of the semiconductive pillar, an opposing sidewall of the semiconductive pillar not adjacent the gate electrode or another gate electrode.

Furthermore, in accordance with embodiments of the disclosure, a method of forming a vertical access device comprises forming a semiconductive base comprising a first source/drain region. A first semiconductive pillar is formed to vertically extend from the semiconductive base. A first gate electrode is formed over a first sidewall of the first semiconductive pillar. A second gate electrode is formed over a second, opposing sidewall of the first semiconductive pillar. A pair of second semiconductive pillars is formed from the first semiconductive pillar, one of the pair of second semiconductive pillars adjacent the first gate electrode, and another of the pair of second semiconductive pillars adjacent the second gate electrode. A second source/drain region is formed in each of the pair of second semiconductive pillars.

Figure 1H:
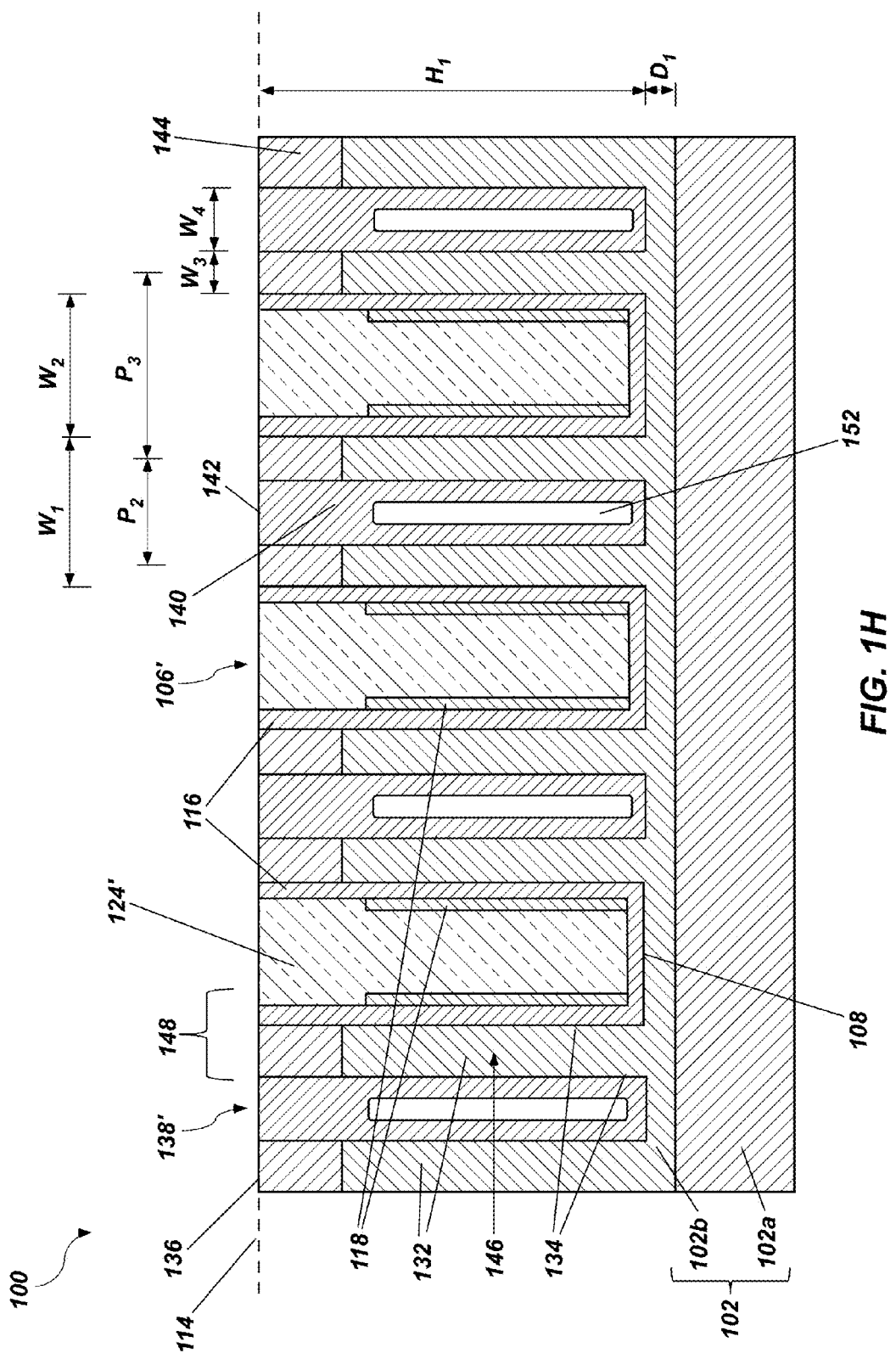

Referring to FIG. 1H, in additional embodiments, open volumes 152 (e.g., void spaces, air gaps) may, optionally, be formed within the second isolation structures 140. Forming the open volumes 152 provides insulators having a dielectric constant (c) of about 1. As shown in FIG. 1H, one side of each of the second semiconductive pillars 132 may be horizontally adjacent (as separated by a portion of the second isolation structures 140) an open volume 152, and another, opposing side of each of the second semiconductive pillars 132 may be horizontally adjacent (as separated by the gate dielectric material 116) a gate electrode 118. Put another way, each of the second semiconductive pillars 132 may be positioned horizontally between (e.g., flanked by) an open volume 152 within an abutting second filled isolation trench 138' and a gate electrode 118 within an abutting first filled isolation trench 106'.

The open volumes 152, if present, may each be formed to have any desired dimensions (e.g., length, width, height) and location. The dimensions and location of the open volumes 152 within the second isolation structures 140 may be selected (e.g., tailored) at least partially based on the material, dimensions, and spacing of at least one of the second isolation structures 140, the second semiconductive pillars 132, the gate dielectric material 116, and the gate electrodes 118. For example, the dimensions and location of the open volumes 152 may be selected, in conjunction with the material, dimensions, and spacing of each of the second isolation structures 140, the second semiconductive pillars 132, the gate dielectric material 116, and the gate electrodes 118, to limit capacitance and increase shorts margin between the gate electrodes 118 of neighboring vertical access devices 148, and to reduce cross-talk between neighboring vertical access devices 148. By way of non-limiting example, if present, the open volumes 152 may each have a width within a range of from about 10 percent to about 100 percent of the width $W_4$ of the second isolation structures 140 (e.g., from about 20 percent to about 90 percent of the width $W_4$, from about 30 percent to about 80 percent of the width $W_4$, or from about 40 percent to about 70 percent of the width $W_4$), may have a height greater than or equal to the height of the gate electrodes 118, and may occupy a horizontally central portion of each of the second isolation structures 140.

The open volumes 152, if present, may be formed within the second isolation structures 140 using conventional processes and conventional processing equipment, which are not described in detail herein. Depending on the processes (e.g., deposition processes, growth processes, material removal processes) utilized to form the second isolation structures 140, the open volumes 152 may be formed before, during, or after the formation of the second isolation structures 140. In some embodiments, the open volumes 152 are formed within the second isolation structures 140 prior to the formation of the source/drain regions 144 in the second semiconductive pillars 132.

Figure 1I:
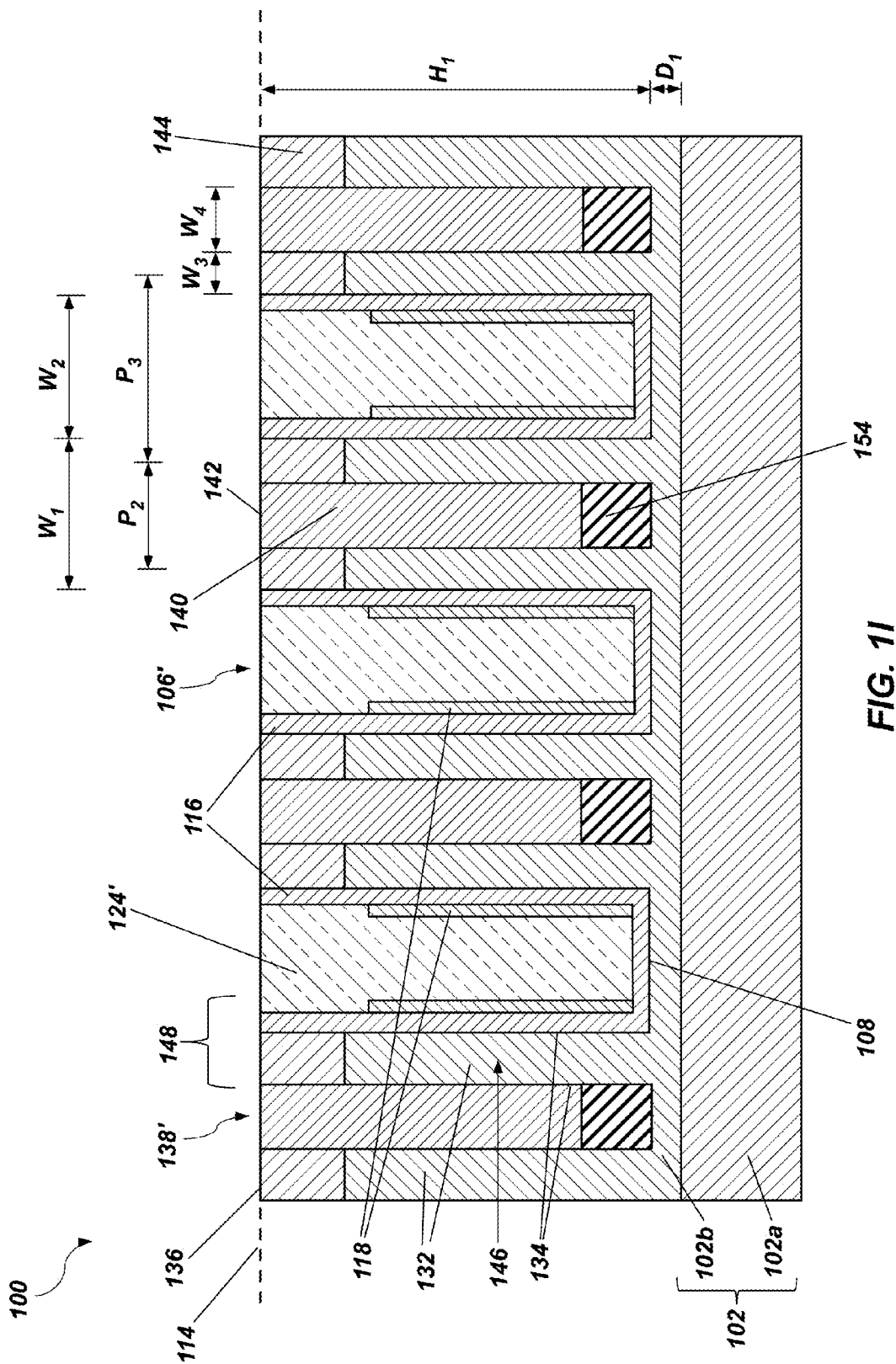

Referring to FIG. 1I, in additional embodiments, body contacts 154 may, optionally, be formed within the second isolation trenches 138 (FIG. 1E) so as to occupy at least a portion of the second filled isolation trenches 138'. The body contacts 154 may underlie the second isolation structures 140, and may run parallel to the gate electrodes 118. Forming the body contacts 154 within the second isolation trenches 138 may alleviate (e.g., reduce or eliminate) floating body effects of the vertical access devices 148. As used herein, the term "floating body" refers to an access device body which is not coupled to, and is therefore insulated from, power or ground rails within an integrated circuit. For a floating body, the potential at the channel region of the access device cannot be set to a specific value, but changes (e.g., floats, adjusts) according to the voltage conditions applied to the adjacent source/drain regions. As a result, the threshold voltage of the access device changes with varying body bias, leading to undesirable parasitic leakage from the access device. If present, the body contacts 154 enable the body of each of the vertical access devices 148 to be connected to a potential source so that the body no longer floats, thereby eliminating floating body effects that may otherwise be associated therewith. The body contacts 154 may be connected to a discharging circuit such as a ground or power supply voltage.

The body contacts 154 may be formed of and include any suitable conductive material including, but not limited to, a conductive silicon material (e.g., a doped polysilicon material), a conductive metal material, or a combination thereof. The conductivity type of the body contacts 154 may depend on the conductivity types of the various regions (e.g., the source/drain region 144 and the channel region 146 of the second semiconductive pillar 132, and the upper region 102b and the lower region 102a of the semiconductive base 102) of the vertical access devices 148 associated (e.g., adjacent) therewith. For example, the body contacts 154 may be formed to have P-type conductivity where the source/drain regions 144 of the second semiconductive pillars 132 and the lower region 102a (e.g., source/drain region) of the semiconductive base 102 each have N-type conductivity and the channel regions 146 of the second semiconductive pillars 132 have P-type conductivity. As another example, the body contacts 154 may be formed to have N-type conductivity where the source/drain regions 144 of the second semiconductive pillars 132 and the lower region 102a of the semiconductive base 102 each have P-type conductivity and the channel regions 146 of the second semiconductive pillars 132 have N-type conductivity. In some embodiments, the body contacts 154 are formed of and include P+ polysilicon.

The body contacts 154 may be formed using conventional processes (e.g., material deposition processes, material removal processes) and conventional processing equipment, which are not described in detail herein. For example, to form the body contacts 154, a conductive material (e.g., P-type polysilicon) may be formed (e.g., deposited) at the bottom of each of the second isolation trenches 138 (FIG. 1E) prior to forming the second isolation structures 140 within the second isolation trenches 138. The second isolation structures 140 may occupy upper portions of the second filled isolation trenches 138' unoccupied by the body contacts 154. The body contacts 154 may be formed to any desired height within the second isolation trenches 138.

Figure 2:
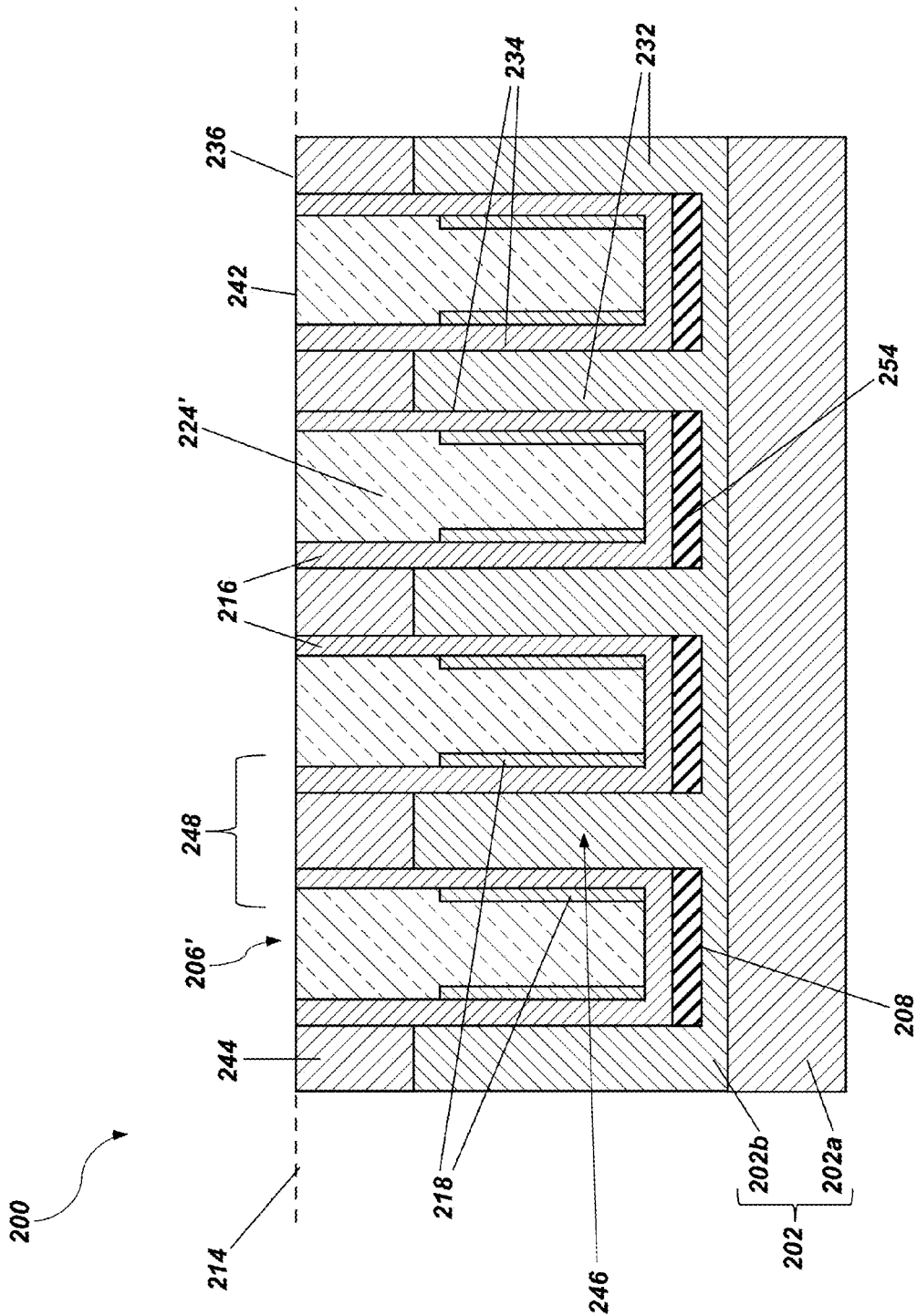
FIG. 2 is a partial cross-sectional view of a semiconductor device structure in accordance with additional embodiments of the disclosure.

One of ordinary skill in the art will appreciate that, in accordance with additional embodiments of the disclosure, body contracts may be included in different semiconductive device structures. For example, referring to FIG. 2, the methods of the disclosure may be used to form body contacts 254 in a semiconductor device structure 200 including vertical access devices 248. As shown in FIG. 2, each of the vertical access devices 248 include a semiconductive pillar 232 including a source/drain region 244 and a channel region 246, a portion of a semiconductive base 202, and a pair of gate electrodes 218. A lower region 202a of the semiconductive base 202 may serve as a shared source/drain region (as well as a buried digit line) for each of the vertical access devices 248. For each of the vertical access devices 248, the source/drain region 244 vertically overlies the channel region 246, and the channel region 246 vertically overlies the lower region 202a of the semiconductive base 202. Two, opposing sides of the second semiconductive pillar 232 of each of the vertical access devices 248 are associated (e.g., adjacent, proximate) with gate electrodes 218. Put another way, opposing sides of the channel region 246 of each of the vertical access devices 248 are each horizontally adjacent (as separated by a gate dielectric material 216) a gate electrode 218. Accordingly, each of the vertical access devices 248 may be considered to be a double-gate vertical access device.

In FIG. 2 and the associated description below, functionally similar features are referred to with similar reference numerals incremented by 100. To avoid repetition, not all features shown in FIG. 2 are described in detail herein. Rather, unless described otherwise below, features designated by a reference numeral that is a 100 increment of the reference numeral of a feature described previously will be understood to be substantially similar to the feature described previously, except with dimensions and spacing conventionally associated with 4 $F^2$ architectures (e.g., 4 $F^2$ DRAM architectures). For example, the semiconductor device structure 200 may include a semiconductive base 202 (including a lower region 202a and an upper region 202b), semiconductive pillars 232 (each including a channel region 246, and a source/drain region 244), a gate dielectric material 216, gate electrodes 218, and isolation structures 224' respectively having substantially similar material compositions to the semiconductive base 102 (including the lower region 102a and the upper region 102b), the second semiconductive pillars 132 (each including the channel region 146, and the source/drain region 144), the gate dielectric material 116, the gate electrodes 118, and the isolation structures 124', except exhibiting dimensions (e.g., width, length, height) and spacing conventionally associated with 4 $F^2$ architectures.

As shown in FIG. 2, the body contacts 254 may be formed within bottom portions of isolation trenches (e.g., isolation trenches similar to the first isolation trenches 106 previously described in relation to the semiconductor device structure 100) separating (e.g., flanking) the semiconductive pillars 232. The body contacts 254 may be formed after the formation of the semiconductive base 202 and the semiconductive pillars 232, and prior to the formation of the gate dielectric material 216, the gate electrodes 218, and the isolation structures 224'. For example, following the formation of the semiconductive base 202 and the semiconductive pillars 232, a conductive material may be formed (e.g., deposited) within the isolation trenches separating the semiconductive pillars 232 to form the body contacts 254. Thereafter, using conventional processes (e.g., deposition processes, growth processes, material removal processes) and conventional processing equipment, the gate dielectric material 216 may be conformally formed on or over upper surfaces of the body contacts 254 and on or over opposing sidewalls 234 of the semiconductive pillars 232, the gate electrodes 218 may be formed on or over the gate dielectric material 216 (i.e., so as to flank the opposing sidewalls 234 of the semiconductive pillars 232), and the isolation structures 224' may be formed within a remaining (e.g., unoccupied) region of the isolation trenches to form filled isolation trenches 206'. The body contacts 254 may be connected to a discharging circuit such as a ground or power supply voltage.

Accordingly, a semiconductor device structure of the disclosure comprises semiconductive pillars vertically extending from a semiconductive base and separated by filled isolation trenches, a conductive material on an upper surface of the semiconductive base exposed within the filled isolation trenches, the conductive material contacting portions of opposing sidewalls of the semiconductive pillars within the filled isolation trenches, a dielectric material on an upper surface of the conductive material and other portions of the opposing sidewalls of the semiconductive pillars within the filled isolation trenches, opposing gate electrodes on opposing side surfaces of the dielectric material within the filled isolation trenches, and isolation structures over and between the opposing gate electrodes within the filled isolation trenches.

Figure 3:
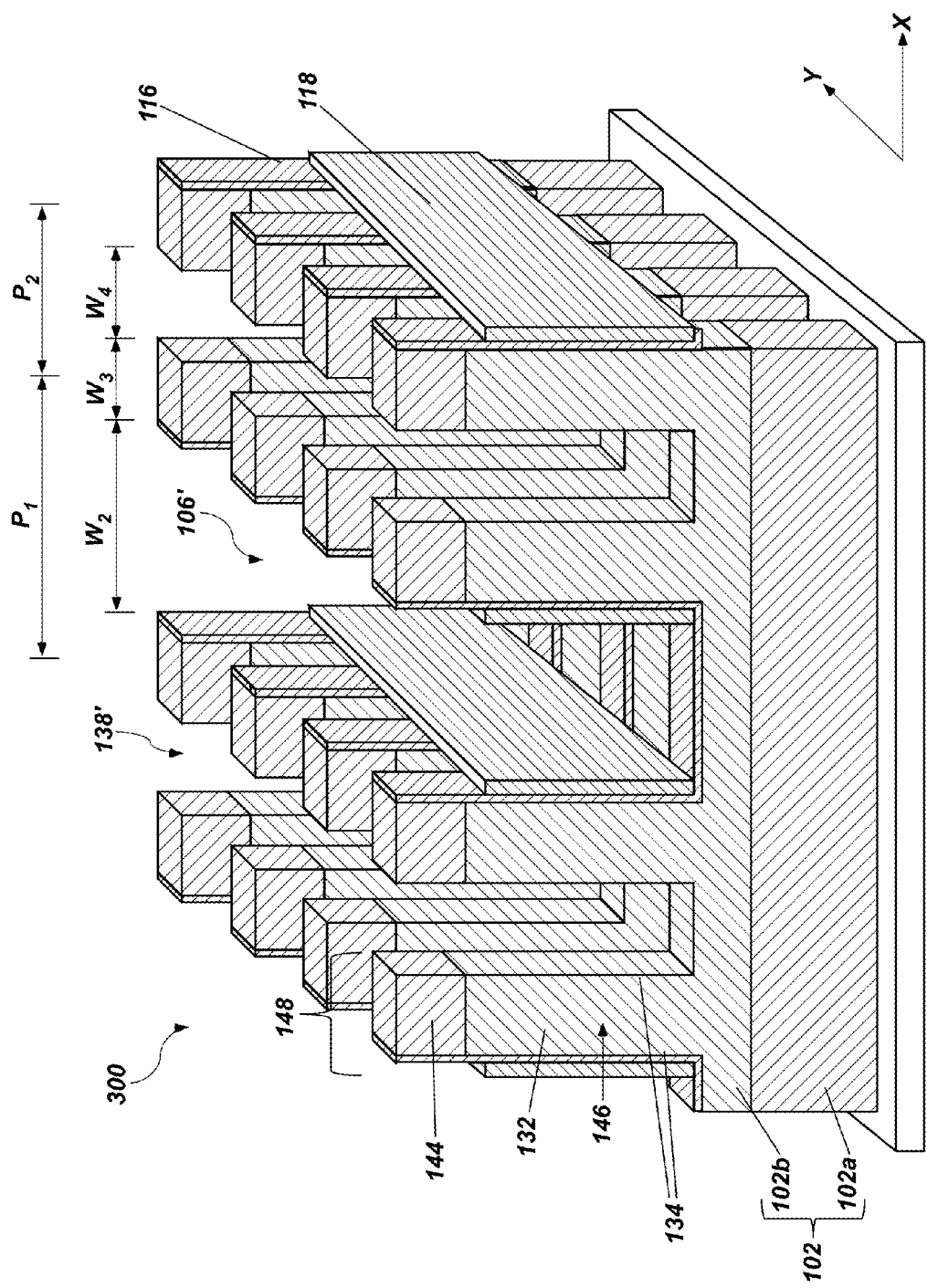
FIG. 3 is a partial perspective view of an array of vertical access devices in accordance with embodiments of the disclosure.

Referring next to FIG. 3, an array of vertical access devices may be formed according to the embodiments described herein. For example, as shown in FIG. 3, an array 300 of the vertical access devices 148 may include rows of the vertical access devices 148 extending in an X direction, and columns of the vertical access devices 148 extending in a Y direction substantially perpendicular to the X direction. For the sake of clarity, the first isolation structures 124' (FIGS. 1F-1I) and the second isolation structures 140 (FIGS. 1F-1I) are not shown within the first filled isolation trenches 106' and the second filled isolation trenches 138' depicted in FIG. 3. The gate electrodes 118, which may serve as word lines for the array 300, may extend in the Y direction (i.e., parallel to the columns of the vertical access devices 148). The body contacts 154 (FIG. 1I), if present, may also extend in the Y direction (i.e., parallel to the gate electrodes 118 and the columns of the vertical access devices 148). Furthermore, as shown in FIG. 3, the semiconductive base 102 may be divided into parallel semiconductive lines extending in the X direction (i.e., under each row of the second semiconductive pillars 132). The lower regions 102a of the divided semiconductive base 102 may serve as a digit lines for the array 300. In additional embodiments, an array of the vertical access devices 248 (FIG. 2) may be formed to include rows of the vertical access devices 248 extending in an X direction, and columns of the vertical access devices 248 extending in a Y direction substantially perpendicular to the X direction.

Figure 4:
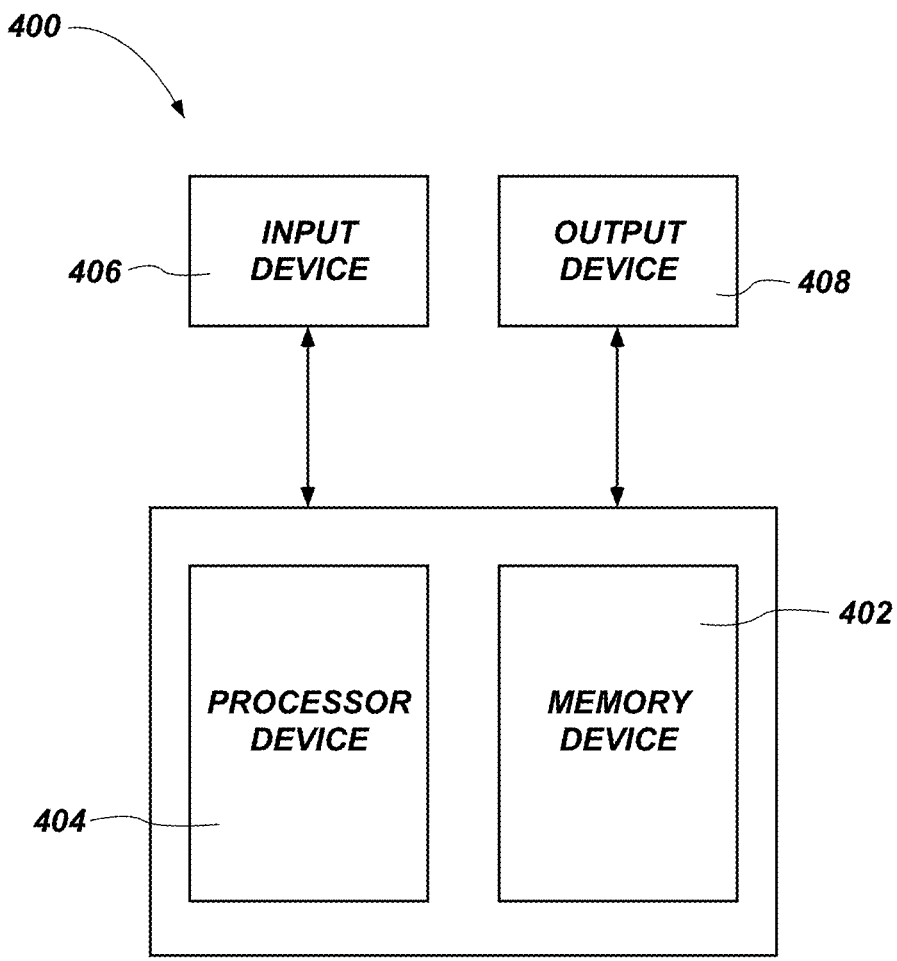
FIG. 4 is a schematic block diagram illustrating an electronic system in accordance with embodiments of the disclosure.

Semiconductor devices (e.g., DRAM devices) that include semiconductive device structures 100, 200 (including the vertical access devices 148, 248) in accordance with embodiments of the disclosure may be used in embodiments of electronic systems of the disclosure. For example, FIG. 4 is a block diagram of an illustrative electronic system 400 according to embodiments of disclosure. The electronic system 400 may comprise, for example, a computer or computer hardware component, a server or other networking hardware component, a cellular telephone, a digital camera, a personal digital assistant (PDA), portable media (e.g., music) player, etc. The electronic system 400 includes at least one memory device 402. The electronic system 400 may further include at least one electronic signal processor device 404 (often referred to as a "microprocessor"). At least one of the electronic signal processor device 404 and the at least one memory device 402 may include, for example, an embodiment of the semiconductor device structure 100 shown in FIGS. 1A-1I, or an embodiment of the semiconductor device structure 200 shown in FIG. 2. Accordingly, at least one of the electronic signal processor device 404 and the at least one memory device 402 may include an embodiment of the single-gate vertical access device 148 as previously described in relation to the semiconductor device structure 100, or an embodiment of the double-gate vertical access device 248 described in relation to the semiconductor device structure 200. The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, a monitor, a display, a printer, an audio output jack, a speaker, etc. In some embodiments, the input device 406 and the output device 408 may comprise a single touch screen device that can be used both to input information to the system 400 and to output visual information to a user. The one or more input devices 406 and output devices 408 may communicate electrically with at least one of the memory device 402 and the electronic signal processor device 404.

The vertical access devices, semiconductor device structures, and formation methods of the disclosure advantageously facilitate improved semiconductor device performance, reduced costs, increased miniaturization of components, and greater packaging density as compared to conventional access devices (e.g., vertical access devices), semiconductor device structures, and formation methods. For example, the vertical access devices, semiconductor device structures, and formation methods of the disclosure may improve one or more of semiconductor device (e.g., DRAM device) scaling, electrical coupling effects, shorts margins, short channel effects, floating body effects, access device cross talk as compared to conventional access devices, semiconductor device structures, and formation methods. In embodiments including the body contacts, the methods of forming the vertical access devices and semiconductor device structures may be conducted without use of an additional mask or reticle to form the body contacts.

The following examples serve to explain embodiments of the present disclosure in more detail. The examples are not to be construed as being exhaustive or exclusive as to the scope of the disclosure.

EXAMPLES

Example 1

The electrical characteristics (e.g., sub-threshold leakage current characteristics) for several single-gate vertical access devices including different semiconductive pillar widths were compared. The configuration of each of the single-gate vertical access devices was substantially similar to the configuration of the vertical access devices 148 depicted in FIG. 1G. The widths of the semiconductive pillar of the different single-gate vertical access devices were incrementally decreased from 24 nm to 10 nm. Each of the single-gate vertical access devices was analyzed without the addition of boron (B) within the channel region thereof. It is believed that the addition of B would further reduce sub-threshold leakage currents.

Figure 5:
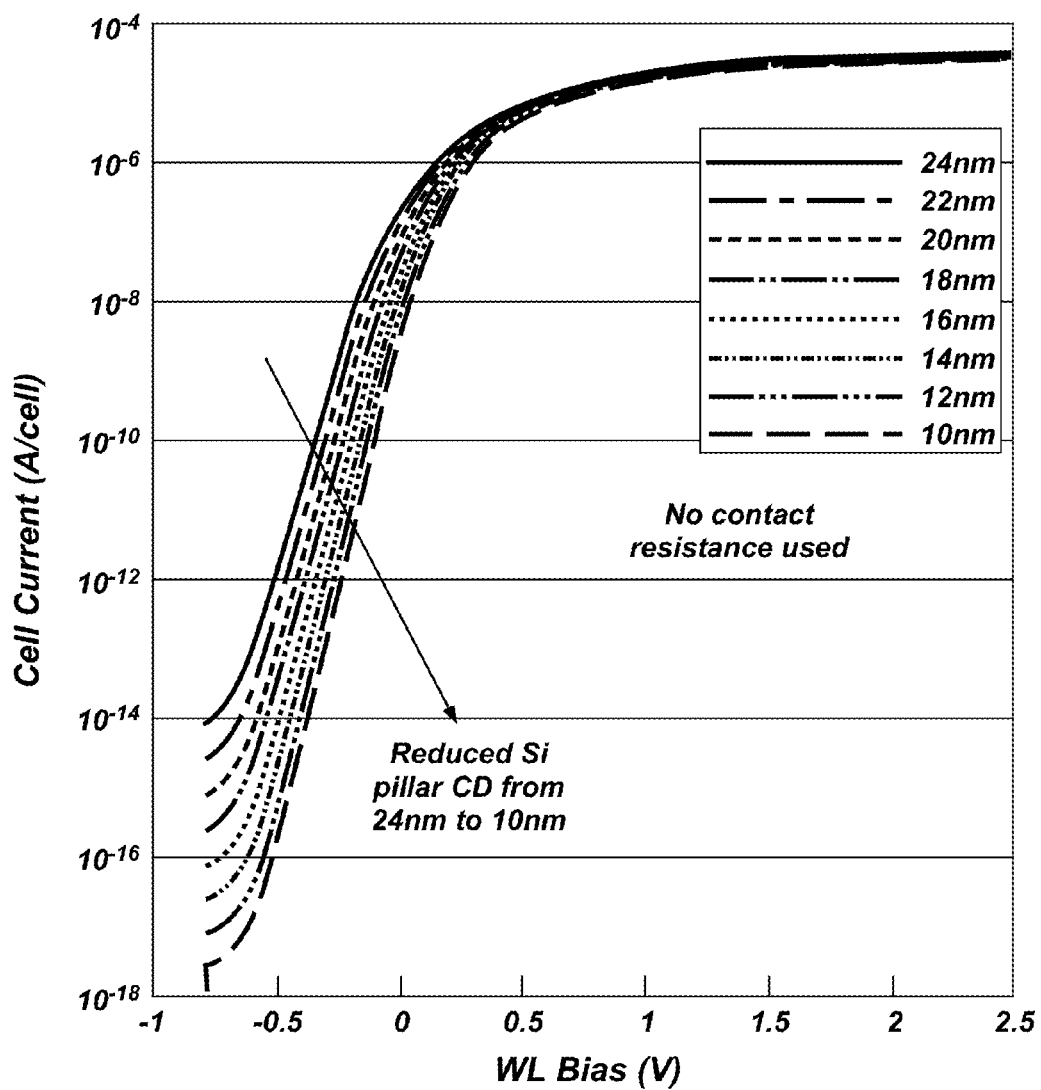
FIG. 5 is a graphical representation of the results described in Example 1.

A graphical representation illustrating cell current (amperes/cell) at different word line biases (i.e., applied voltages) from 0 Volts (V) to 2.5 V for each of the single-gate vertical access devices analyzed is shown in FIG. 5. FIGS. 6 through 8 are contour plots of current density throughout the semiconductive pillars of single-gate vertical access devices having semiconductive pillar widths of 24 nm, 16 nm, and 10 nm, respectively. Each of the single-gate vertical access devices exhibited suppressed short channel effects, and a sub-threshold leakage current slope comparable to a conventional double-gate vertical access device. In addition, the results indicate that single-gate vertical access devices of the disclosure exhibit reduced sub-threshold leakage current with decreasing semiconductive pillar widths.

Example 2

The electrical characteristics (e.g., neighboring device coupling characteristics) between neighboring single-gate vertical access devices including different spacings and isolation structures (i.e., a silicon oxide structure, or a silicon oxide structures with a void space therein) therebetween were compared. The configuration of the neighboring single-gate vertical access devices was substantially similar to the configuration of the neighboring vertical access devices 148 (i.e., including the second semiconductive pillars 132, and the second isolation structures 140) depicted in FIGS. 1G and 1H. The widths of isolation structures between the neighboring single-gate vertical access devices (i.e., corresponding the spacing between the neighboring single-gate vertical access devices) were incrementally increased from 8 nm to 38 nm. In addition, the effect of a 5 nm void space (e.g., air gap) within the isolation structures for of the different isolation structure widths was also analyzed.

Figure 10:
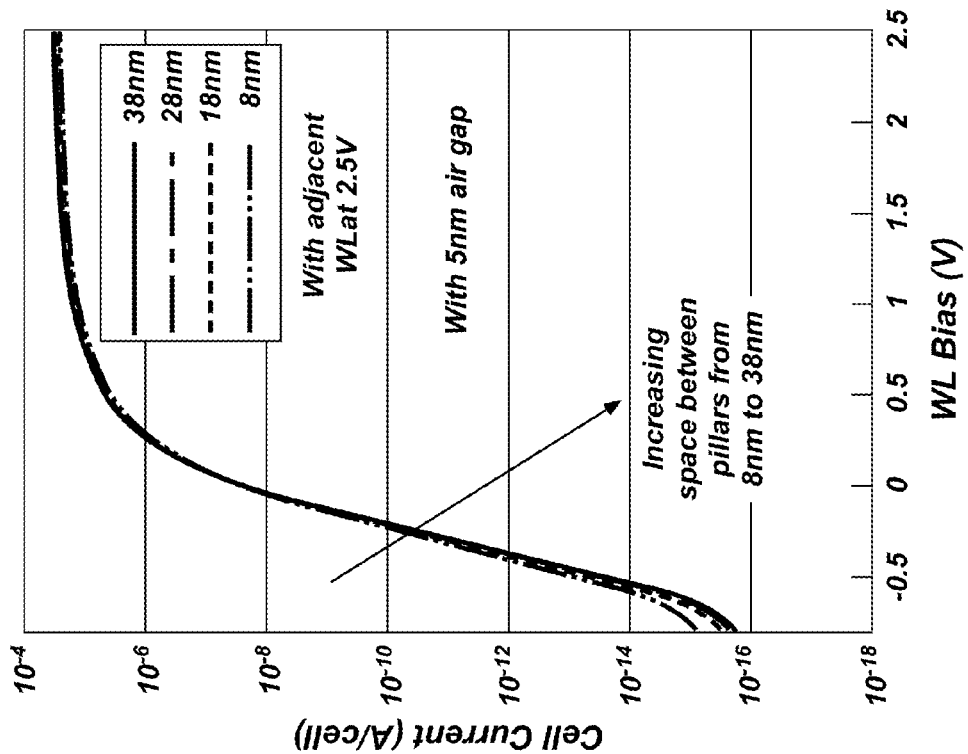
FIGS. 9 and 10 are graphical representations of the results described in Example 2.
Figure 9:
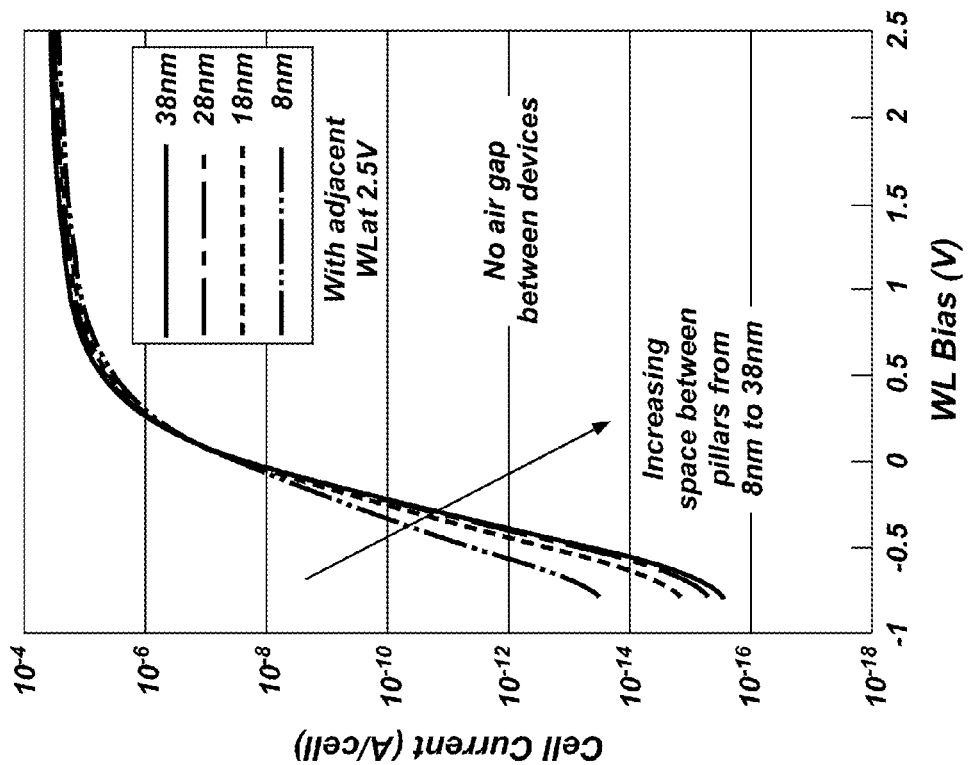

A graphical representation illustrating cell current (amperes/cell) at different word line biases from 0 V to 2.5 V for the different isolation structure widths analyzed (i.e., the different spacings between neighboring single-gate vertical access devices) without the presence of the void space in the isolation structure is shown in FIG. 9. A graphical representation illustrating cell current (amperes/cell) at different word line biases (i.e., applied voltages) from 0 V to 2.5 V for the different isolation structure widths analyzed with the presence of the void space in the isolation structure is shown in FIG. 10. FIGS. 11 and 12 are contour plots of current density throughout the semiconductive pillars of a pair of neighboring single-gate vertical access devices separated by an 18 nm wide silicon dioxide isolation structure, without a void space in the silicon dioxide isolation structure and with a 5 nm void space in the silicon dioxide isolation structure, respectively. The different isolation structures were each able to limit capacitance between the gate electrodes (e.g., word lines) of neighboring single-gate vertical access devices. In addition, the presence of the void space further reduced capacitance between the gate electrodes of neighboring single-gate vertical access devices.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:
1. A vertical access device, comprising:
a semi conductive base comprising a first source/drain region;
a semi conductive pillar extending vertically from the semiconductive base, the semiconductor pillar exhibiting a substantially uniform width up to a height thereof and comprising: a channel region overlying the first source/drain region; and a second source/drain region overlying the channel region;
a gate dielectric material adjacent a substantially planar sidewall of the semiconductive pillar;
a gate electrode adjacent the gate dielectric material;
an isolation structure comprising a dielectric material adjacent another substantially planar sidewall of the semiconductive pillar opposing the substantially planar sidewall, the isolation structure not adjacent the gate electrode, not adjacent the gate dielectric material, and not adjacent any other gate electrode; and
a body contact underlying the isolation structure and comprising conductive material adjacent a lower portion of the another substantially planar sidewall of the semiconductive pillar.
2. The vertical access device of claim 1, wherein the semiconductive base comprises:
a lower region comprising the first source/drain region; and an upper region between the lower region and the semiconductive pillar, and comprising the same conductivity type as the channel region of the semiconductive pillar.

3. The vertical access device of claim 1, wherein the gate electrode is vertically between a top of the first source/drain region and a bottom of the second source/drain region.

4. The vertical access device of claim 1, wherein the first source/drain region and the second source/drain region exhibit N-type conductivity, and the channel region exhibits P-type conductivity.

5. A method of forming a vertical access device, comprising: forming a semiconductive base comprising a first source/drain region;
forming a first semiconductive pillar vertically extending from the semiconductive base; forming a first gate electrode over a first sidewall of the first semiconductive pillar; forming a second gate electrode over a second, opposing sidewall of the same first semiconductive pillar;
forming a pair of second semiconductive pillars from the first semiconductive pillar, one of the pair of second semiconductive pillars adjacent the first gate electrode, and another of the pair of second semiconductive pillars adjacent the second gate electrode; forming a second source/drain region in each of the pair of second semiconductive pillars after forming the pair of second semiconductive pillars, the second source/drain region vertically overlying the first source/drain region;
forming a conductive material in a lower portion of a trench between the pair of second semiconductive pillars; and
forming an isolation structure comprising a dielectric material over the conductive material and within the trench between the pair of second semiconductive pillars.

6. The method of claim 5, further comprising forming a gate dielectric material on the first sidewall of the first semiconductive pillar and on the second, opposing sidewall of the first semiconductive pillar.

7. The method of claim 5, wherein forming a semiconductive base comprises:
forming a lower region of the semiconductive base comprising the first source/drain region; and
forming an upper region of the semiconductive base having an opposite conductivity type than the lower region of the semiconductive base.

8. The method of claim 5, wherein forming a pair of second semiconductive pillars from the first semiconductive pillar comprises removing a central portion of the first semiconductive pillar.

9. The method of claim 5, further comprising forming an isolation structure between the pair of second semiconductive pillars.

10. A semiconductor device structure, comprising:
at least one semiconductive pillar vertically extending from a semiconductive base;
a first filled isolation trench located on a first side of the at least one semiconductive pillar;
a second filled isolation trench located on a second, opposite side of the at least one semiconductive pillar;
a gate dielectric material on side surfaces of the at least one semiconductive pillar within the first filled isolation trench;
a pair of gate electrodes on side surfaces of the gate dielectric material within the first filled isolation trench;
a first isolation structure overlying and between surfaces of the pair of gate electrodes and the gate dielectric material within the first filled isolation trench;
a second isolation structure on surfaces of the at least one semiconductive pillar within the second filled isolation trench; and
a conductive material within the second filled isolation trench and underlying the second isolation structure.

11. The semiconductor device structure of claim 10, further comprising a void space within the second isolation structure.

12. The semiconductor device structure of claim 10, wherein a width of the first filled isolation trench is greater than a width of the second filled isolation trench.

13. The semiconductor device structure of claim 10, wherein the semiconductive base comprises a lower region exhibiting a first conductivity type, and an upper region exhibiting a second conductivity type.

14. The semiconductor device structure of claim 13, wherein the at least one semiconductive pillar comprises a lower region exhibiting the second conductivity type, and an upper region exhibiting the first conductivity type.

15. The semiconductor device structure of claim 10, further comprising:
another semiconductive pillar located on a side of the first filled isolation trench opposite the first side of the at least one semiconductive pillar; and
an additional semiconductive pillar located on a side of the second filled isolation trench opposite the second side of the at least one semiconductive pillar.

16. The semiconductor device structure of claim 15, wherein the first side of the at least one semiconductive pillar is horizontally adjacent one of the pair of gate electrodes within the first filled isolation trench, and wherein a side of the another semiconductive pillar opposing the first side of the at least one semiconductive pillar is horizontally adjacent the other of the pair of gate electrodes within the first filled isolation trench.

17. A method of forming a semiconductor device structure, comprising:
forming first semiconductive pillars vertically extending from a semiconductive base and separated from one another by first isolation trenches;
forming gate electrodes over opposing sidewalls of the first semiconductive pillars exposed within the first isolation trenches;
forming first isolation structures over and between the gate electrodes within the first isolation trenches;
forming second isolation trenches in the first semiconductive pillars to form second semiconductive pillars, each of the second semiconductive pillars adjacent one of the gate electrodes;
forming body contacts comprising conductive material at bottoms of the second isolation trenches; and
forming second isolation structures in the second isolation trenches.

18. The method of claim 17, wherein forming first isolation structures over and between the gate electrodes within the first isolation trenches comprises forming the first isolation structures to comprise lower portions contained within the first isolation trenches, and upper portions extending beyond vertical boundaries of the first isolation trenches and each having substantially the same width as each of the first isolation trenches.

19. The method of claim 18, wherein forming second isolation trenches in the first semiconductive pillars comprises:

forming spacers on opposing sidewalls of the upper portions of the first isolation structures and over portions of upper surfaces of the first semiconductive pillars; and at least partially removing regions of the first semiconductive pillars remaining uncovered by the spacers.

20. The method of claim 19, further comprising removing the spacers and the upper portions of the first isolation structures after forming the second isolation trenches.

21. The method of claim 17, wherein forming second isolation structures in the second isolation trenches comprises forming the second isolation structures on and between sidewalls of the second semiconductive pillars exposed within the second isolation trenches.

22. The method of claim 17, further comprising forming void spaces within central regions of the second isolation structures.

23. A semiconductor device structure, comprising:

semiconductive pillars vertically extending from a semiconductive base and separated by filled isolation trenches;

a conductive material directly on an upper surface of the semiconductive base within the filled isolation trenches, the conductive material extending completely between and directly contacting portions of opposing sidewalls of the semiconductive pillars within the filled isolation trenches;

a dielectric material on an upper surface of the conductive material and other portions of the opposing sidewalls of the semiconductive pillars within the filled isolation trenches;

opposing gate electrodes on opposing side surfaces of the dielectric material within the filled isolation trenches; and isolation structures over and between the opposing gate electrodes within the filled isolation trenches.

* * * * *

UNITED STATES PATENT AND TRADEMARK OFFICE
CERTIFICATE OF CORRECTION

PATENT NO. : 9,773,888 B2  
APPLICATION NO. : 14/190807  
DATED : September 26, 2017  
INVENTOR(S) : Srinivas Pulugurtha et al.

It is certified that error appears in the above-identified patent and that said Letters Patent is hereby corrected as shown below:

In the Specification

| | | |
|---|---|---|
| Column 3, | Line 41, | change "to from the" to --to form the-- |
| Column 5, | Line 46, | change "about 1.2 F" to --about 1.2F-- |
| Column 5, | Line 47, | change "about 1.2 F," to --about 1.2F,-- |
| Column 5, | Line 49, | change "pitch, 2 F)" to --pitch, 2F)-- |
| Column 5, | Line 52, | change "pitches, 2 F," to --pitches, 2F,-- |
| Column 5, | Line 55, | change "about 2 F." to --about 2F.-- |
| Column 5, | Line 58, | change "about 0.8 F." to --about 0.8F.-- |
| Column 9, | Line 26, | change "about 0.4 F" to --about 0.4F-- |
| Column 9, | Line 29, | change "about 0.4 F" to --about 0.4F-- |
| Column 9, | Line 32, | change "about 0.8 F" to --about 0.8F-- |
| Column 9, | Line 36, | change "about 0.8 F" to --about 0.8F-- |
| Column 9, | Line 40, | change "about 1.2 F" to --about 1.2F-- |
| Column 10, | Line 59, | change "0.4 F) and" to --0.4F) and-- |
| Column 10, | Line 59, | change "about 0.4 F)" to --about 0.4F)-- |
| Column 10, | Line 64, | change "about 0.4 F)" to --about 0.4F)-- |
| Column 11, | Line 5, | change "about 0.4 F)," to --about 0.4F),-- |
| Column 11, | Line 11, | change "about 0.8 F)" to --about 0.8F)-- |
| Column 11, | Line 15, | change "about 0.8 F)" to --about 0.8F)-- |
| Column 11, | Line 18, | change "about 1.2 F)" to --about 1.2F)-- |
| Column 14, | Lines 12-13, | change "material is totaled." to --material is formed.-- |
| Column 14, | Line 18, | change "to total the" to --to form the-- |
| Column 14, | Line 28, | change "from the first" to --form the first-- |
| Column 14, | Line 56, | change "constant (c) of" to --constant ($\varepsilon$) of-- |
| Column 17, | Line 4, | change "with 4 F$^2$" to --with 4F$^2$-- |
| Column 17, | Line 4, | change "(e.g., 4 F$^2$" to --(e.g., 4F$^2$-- |
| Column 17, | Lines 18-19, | change "with 4 F$^2$" to --with 4F$^2$-- |

Signed and Sealed this  
Twenty-first Day of November, 2017

Joseph Matal  
*Performing the Functions and Duties of the  
Under Secretary of Commerce for Intellectual Property and  
Director of the United States Patent and Trademark Office*

CERTIFICATE OF CORRECTION (continued)
U.S. Pat. No. 9,773,888 B2

In the Claims

| | | | |
|---|---|---|---|
| Claim 1, | Column 20, | Line 43, | change "semi conductive base" to --semiconductive base-- |
| Claim 1, | Column 20, | Line 45, | change "semi conductive pillar" to --semiconductive pillar-- |